US010854710B2

(12) United States Patent
Tanaka

(10) Patent No.: US 10,854,710 B2
(45) Date of Patent: Dec. 1, 2020

(54) SEMICONDUCTOR DEVICE

(71) Applicant: SOCIONEXT, INC., Yokohama (JP)

(72) Inventor: Hidetoshi Tanaka, Aichi (JP)

(73) Assignee: SOCIONEXT, INC., Kanagawa (JP)

( * ) Notice: Subject to any disclaimer, the term of this patent is extended or adjusted under 35 U.S.C. 154(b) by 0 days.

(21) Appl. No.: 16/563,670

(22) Filed: Sep. 6, 2019

(65) Prior Publication Data
US 2019/0393302 A1  Dec. 26, 2019

Related U.S. Application Data

(62) Division of application No. 15/972,949, filed on May 7, 2018, now Pat. No. 10,461,150.

(30) Foreign Application Priority Data

May 22, 2017  (JP) ................. 2017-100704

(51) Int. Cl.
  *H01L 29/06*  (2006.01)
  *H01L 27/088*  (2006.01)
  (Continued)

(52) U.S. Cl.
  CPC ...... *H01L 29/0619* (2013.01); *H01L 27/0266* (2013.01); *H01L 27/0292* (2013.01);
  (Continued)

(58) Field of Classification Search
  CPC ............. H01L 29/0619; H01L 29/0886; H01L 27/0292; H01L 29/755; H01L 29/0673;
  (Continued)

(56) References Cited

U.S. PATENT DOCUMENTS 6,448,645 B1   9/2002 Kimura et al.
7,250,660 B1 *  7/2007 Huang ................ H01L 27/0266
                                                       257/173
(Continued)

FOREIGN PATENT DOCUMENTS

JP   2003-179206 A   6/2003
JP   2007-511898 A   5/2007
JP   2009-147040 A   7/2009

OTHER PUBLICATIONS

Non-Final Office Action issued in U.S. Appl. No. 15/972,949, dated Feb. 5, 2019.
(Continued)

*Primary Examiner* — Kyoung Lee
*Assistant Examiner* — Christina A Sylvia
(74) *Attorney, Agent, or Firm* — McDermott Will & Emery LLP

(57) ABSTRACT

A semiconductor device includes a first transistor formed on a substrate and including first and second impurity regions, a second transistor formed on the substrate and including a third impurity region electrically connected to the second impurity region, and a fourth impurity region, a power supply terminal electrically connected to the first impurity region, a ground terminal electrically connected to the fourth impurity region, a first guard ring surrounding the first transistor in a plan view and electrically connected to the ground terminal, and a second guard ring surrounding the second transistor in a plan view and electrically connected to the ground terminal. A conductivity type of the first through fourth impurity regions is different from a conductivity type of the first and second guard rings. The second guard ring has a width narrower than a width of the first guard ring in a plan view.

18 Claims, 22 Drawing Sheets

(51) Int. Cl.
*H01L 27/02* (2006.01)
*H01L 29/775* (2006.01)

(52) U.S. Cl.
CPC ...... *H01L 27/0886* (2013.01); *H01L 29/0673* (2013.01); *H01L 29/775* (2013.01)

(58) Field of Classification Search
CPC .................. H01L 27/0266; H01L 27/0886; H01L 27/251
See application file for complete search history.

(56) References Cited

U.S. PATENT DOCUMENTS

| | | | |
|---|---|---|---|
| 9,324,617 B1* | 4/2016 | Akarvardar | H01L 21/02428 |
| 2003/0058027 A1* | 3/2003 | Kwon | H01L 27/027 |
| | | | 327/401 |
| 2005/0078419 A1 | 4/2005 | Stockinger et al. | |
| 2007/0187782 A1* | 8/2007 | Kato | H01L 29/0619 |
| | | | 257/409 |
| 2009/0207539 A1 | 8/2009 | Sukuzi | |
| 2012/0176710 A1* | 7/2012 | Domanski | H01L 27/0285 |
| | | | 361/56 |
| 2012/0292712 A1 | 11/2012 | Baek et al. | |
| 2016/0163691 A1 | 6/2016 | Edwards et al. | |
| 2018/0337231 A1* | 11/2018 | Tanaka | H01L 29/0619 |

OTHER PUBLICATIONS

Notice of Allowance issued in U.S. Appl. No. 15/972,949, dated Jun. 7, 2019.

Non-Final Office Action issued in corresponding U.S. Appl. No. 15/972,949, dated Feb. 5, 2019.

Notice of Allowance issued in corresponding U.S. Appl. No. 15/972,949, dated Jun. 7, 2019.

* cited by examiner

SEMICONDUCTOR DEVICE

CROSS-REFERENCE TO RELATED APPLICATIONS

This application is a Divisional Application of U.S. patent application Ser. No. 15/972,949, filed on May 7, 2018, now U.S. Pat. No. 10,461,150, which claims the benefit of priority of the Japanese Patent Application No. 2017-100704, filed on May 22, 2017, the entire disclosures of which Applications are incorporated herein by reference.

BACKGROUND OF THE INVENTION

1. Field of the Invention

The present invention relates to a semiconductor device.

2. Description of the Related Art

In semiconductor devices, it is known to provide an ESD (Electro Static Discharge) protection circuit between a power supply terminal (VDD) and a ground terminal (VSS). For example, the semiconductor device may be provided with two N-channel MOSFETs (Metal-Oxide-Semiconductor Field-Effect-Transistors) that are connected in series between the power supply terminal and the ground terminal, as the ESD protection circuit. In this semiconductor device, the two N-channel MOSFETs are surrounded by a P-type impurity region (or guard ring), as proposed in Japanese Laid-Open Patent Publications No. 2009-147040 and No. 2003-179206, Japanese National Publication of International Patent Application No. 2007-511898, and U.S. Patent Publication US 2016/0163691 A1, for example.

However, in the semiconductor device described above, detailed structures for improving a protection capability of the ESD protection circuit have not been studied.

SUMMARY OF THE INVENTION

Accordingly, it is an object in one aspect of the embodiments to provide a semiconductor device which can improve the protection capability of the ESD protection circuit.

According to one aspect of embodiments of the present invention, a semiconductor device includes a substrate; a first transistor formed on the substrate, and including a first impurity region of a first conductivity type, and a second impurity region of the first conductivity type; a second transistor formed on the substrate, and including a third impurity region of the first conductivity type electrically connected to the second impurity region, and a fourth impurity region of the first conductivity type; a power supply terminal electrically connected to the first impurity region; a ground terminal electrically connected to the fourth impurity region; a first guard ring of a second conductivity type different from the first conductivity type, formed on the substrate, surrounding the first transistor in a plan view, and electrically connected to the ground terminal; and a second guard ring of the second conductivity type, formed on the substrate, surrounding the second transistor in a plan view, and electrically connected to the ground terminal, wherein the second guard ring has a width narrower than a width of the first guard ring in a plan view.

Other objects and further features of the present invention may be apparent from the following detailed description when read in conjunction with the accompanying drawings.

BRIEF DESCRIPTION OF THE DRAWINGS

FIG. 22 is a diagram for explaining an arrangement of a VDD wiring, a VSS wiring, or the like.

DESCRIPTION OF THE PREFERRED EMBODIMENTS

Figure 1:
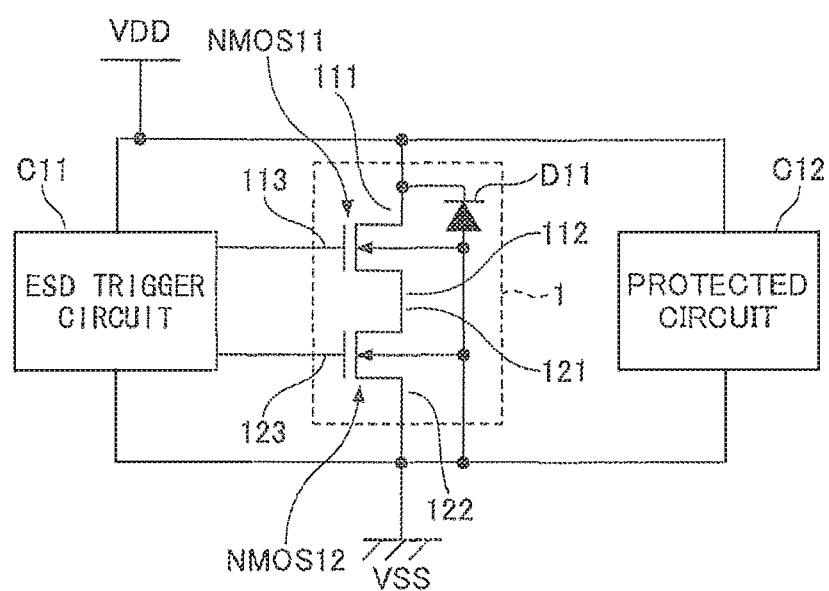
FIG. 1 is a circuit diagram of a semiconductor device in a first embodiment.

Embodiments and modifications will be described with reference to the drawings. In the drawings, constituent elements that are the same are designated by the same reference numerals, and a description of the same reference numerals may be omitted. In this specification a first conductivity type refers to an N-type of a P-type, and a second conductivity type refers to the P-type or the N-type that is a conductivity type opposite to the first conductivity type.

First Embodiment

FIG. 1 is a circuit diagram of a semiconductor device in a first embodiment. As illustrated in FIG. 1, a semiconductor device 1 includes an NMOS 11 which is an N-channel MOSFET (Metal-Oxide-Semiconductor Field-Effect-Transistor), and an NMOS 12 which is an N-channel MOSFET. The NMOS 11 is an example of a first transistor, and the NMOS 12 is an example of a second transistor. The NMOS 11 and the NMOS 12 are connected in series between a power supply terminal VDD and a ground terminal VSS. An ESD trigger circuit C11 is connected to a gate electrode 113 of the NMOS 11 and a gate electrode 123 of the NMOS 12. A reference numeral D11 denotes a parasitic diode.

The ESD trigger circuit C11 detects an ESD surge, and turns on the NMOS 11 and the NMOS 12 within a surge generation time. Hence, it is possible to protect a protected circuit C12, that is connected between the power supply terminal VDD and the ground terminal VSS, from the ESD surge. The protected circuit C12 may be all of the circuits connected between the power supply terminal VDD and the ground terminal VSS.

In the first embodiment, a case is described in which the semiconductor device 1 includes planar FETs.

Figure 2:
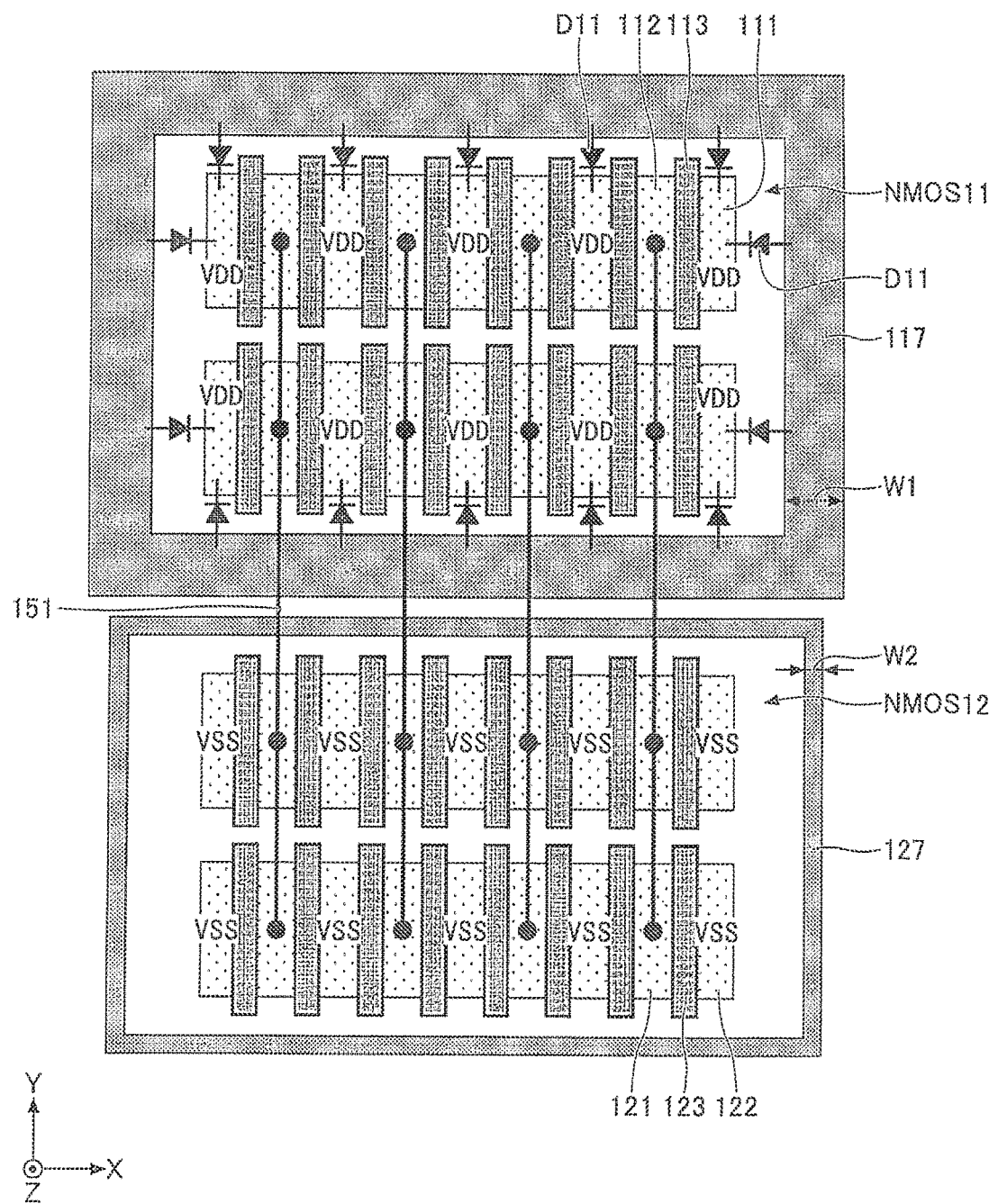
FIG. 2 is a plan view illustrating an example of a structure of the semiconductor device in the first embodiment.

FIG. 2 is a plan view (part 1) illustrating an example of a structure of the semiconductor device in the first embodiment. As illustrated in FIG. 1 and FIG. 2, a first impurity region 111 of the N-type, in the NMOS 11, is electrically connected to the power supply terminal VDD through a VDD wiring (not illustrated in FIG. 2). In addition, a fourth impurity region 122 of the N-type, in the NMOS 12, is electrically connected to the ground terminal VSS through a VSS wiring (not illustrated in FIG. 2). Further, a second impurity region 112 of the N-type in the NMOS 11, and a third impurity region 121 of the N-type in the NMOS 12 are connected through a wiring 151. In FIG. 2, the wiring 151 is illustrated in a simplified manner.

The first impurity region 111, the second impurity region 112, and the gate electrode 113 of the NMOSs 11 are surrounded by a guard ring 117 in a plan view. The guard ring 117 is an example of a first guard ring, and is formed by a P-type impurity region. In addition, the third impurity region 121, the fourth impurity region 122, and the gate electrode 123 of the NMOSs 12 are surrounded by a guard ring 127 in a plan view. The guard ring 127 is an example of a second guard ring, and is formed by a P-type impurity region. The guard ring 117 and the guard ring 127 are electrically connected through a substrate, and the guard ring 127 is connected to the VSS wiring. The guard ring 117 and the guard ring 127 may be connected through a wiring on the substrate.

In this specification, a "guard ring" refers to an impurity region formed on the substrate, that surrounds one or more transistors, or a circuit. In cases described later in which a Fin FET or a nanowire FET is used, the "guard ring" may refer to an impurity region that intermittently or discontinuously surrounds the one or more transistors, or the circuit. Further, a plan view of the semiconductor device or parts thereof refers to a view from above the semiconductor device or parts thereof in a direction perpendicular to a substrate surface on which various layers of the semiconductor device are formed.

In a plan view of the semiconductor device 1, a width W1 of the guard ring 117 surrounding the NMOSs 11 is wider than a width W2 of the guard ring 127 surrounding the NMOSs 12. In other words, the guard ring 127 is narrower than the guard ring 117 in a plan view. For this reason, a resistance of the guard ring 117 is lower than a resistance of the guard ring 127. As a result, an ESD current more easily flows from the guard ring 117 towards the power supply terminal VDD through the parasitic diode D11. Hence, it is possible to improve the protection capability against the ESD surge with respect to the protected circuit C12.

FIG. 2 illustrates an example in which the NMOSs 11 are arranged inside the guard ring 117 in two stages along a Y-direction, and the NMOSs 12 are arranged inside the guard ring 127 in two stages along the Y-direction, however, the arrangements of the NMOSs 11 and the NMOSs 12 are not limited to such arrangements. For example, the NMOSs 11 may be arranged inside the guard ring 117 in one stage or in three or more stages along the Y-direction. In addition, the NMOSs 12 may be arranged inside the guard ring 127 in one stage or in three or more stages along the Y-direction.

Figure 3:
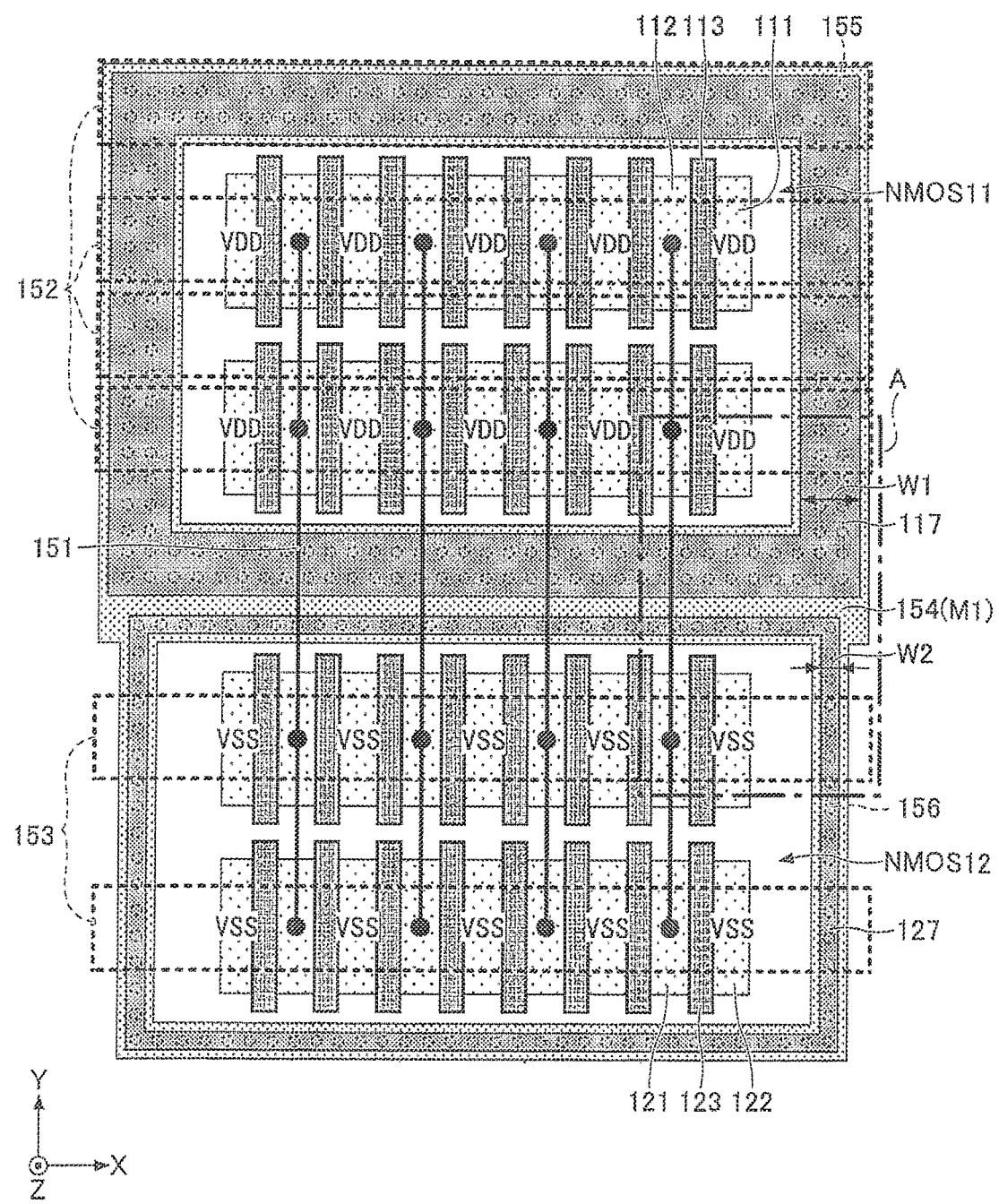
FIG. 3 is a plan view illustrating the example of the structure of the semiconductor device in the first embodiment.

Next, a more detailed description will be given of a layout of the semiconductor device 1. FIG. 3 is a plan view (part 2) illustrating the example of the structure of the semiconductor device in the first embodiment. In FIG. 3, the illustration of the parasitic diode D11 is omitted.

As illustrated in FIG. 3, VDD wirings 152 are arranged above the NMOSs 11 and above the guard ring 117, and VSS wirings 153 are arranged above the NMOSs 12 and above the guard ring 127. A wiring 154 electrically connects the guard ring 117, the guard ring 127, the fourth impurity regions 122, and the ground terminal VSS.

More particularly, the wiring 154 is connected to the guard ring 117 through vias 155 (vias V0) that are arranged on the guard ring 117. In addition, the wiring 154 is connected to the guard ring 127 through vias 156 (vias V0) that are arranged on the guard ring 127. Further, the wiring 154 is connected to the fourth impurity regions 122 (VSS). The wiring 154 is arranged to include parts overlapping the guard ring 117 and the guard ring 127 in a plan view. Between the NMOSs 11 and the NMOSs 12, the wiring 154 is arranged to include a part overlapping both the guard ring 117 and the guard ring 127 in a plan view. The wiring 154 is arranged to surround the NMOSs 11 and the NMOSs 12 in a plan view.

In FIG. 3, the illustration of parts of the wiring 154 connecting to the fourth impurity regions 122 (VSS) is omitted. In addition, in FIG. 3, the wiring 151 that connects the second impurity regions 112 and the third impurity regions 121 is illustrated in a simplified manner. The wiring 151 is provided in a metal wiring layer (for example, a metal wiring layer M2) that is different from a metal wiring layer in which the wiring 154 is provided.

The number of vias 155 that are provided is larger than the number of vias 156 that are provided. By making the number of vias 155 greater than the number of vias 156, it is possible to reduce an electrical resistance between the wiring 154 and the guard ring 117 compared to an electrical resistance between the wiring 154 and the guard ring 127. As a result, the ESD current more easily flows towards the power supply terminal VDD.

Further, the vias 155 may be arranged on the guard ring 117 and surround the NMOSs 11 in a plan view, and the vias 156 may be arranged on the guard ring 127 and surround the NMOSs 12 in a plan view.

Figure 4:
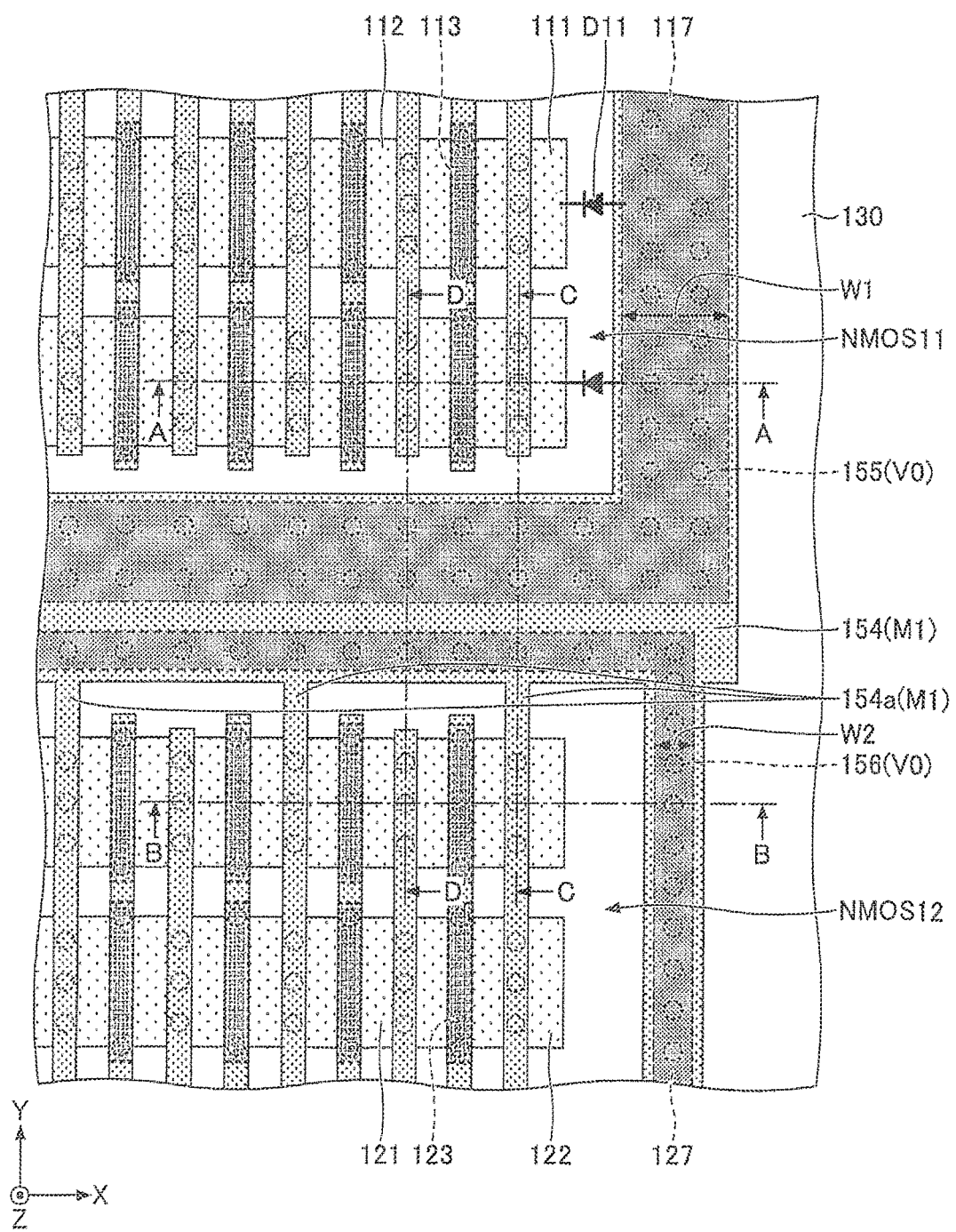
FIG. 4 is a plan view illustrating a substrate up to a metal wiring layer M1 of the semiconductor device in the first embodiment.
Figure 5:
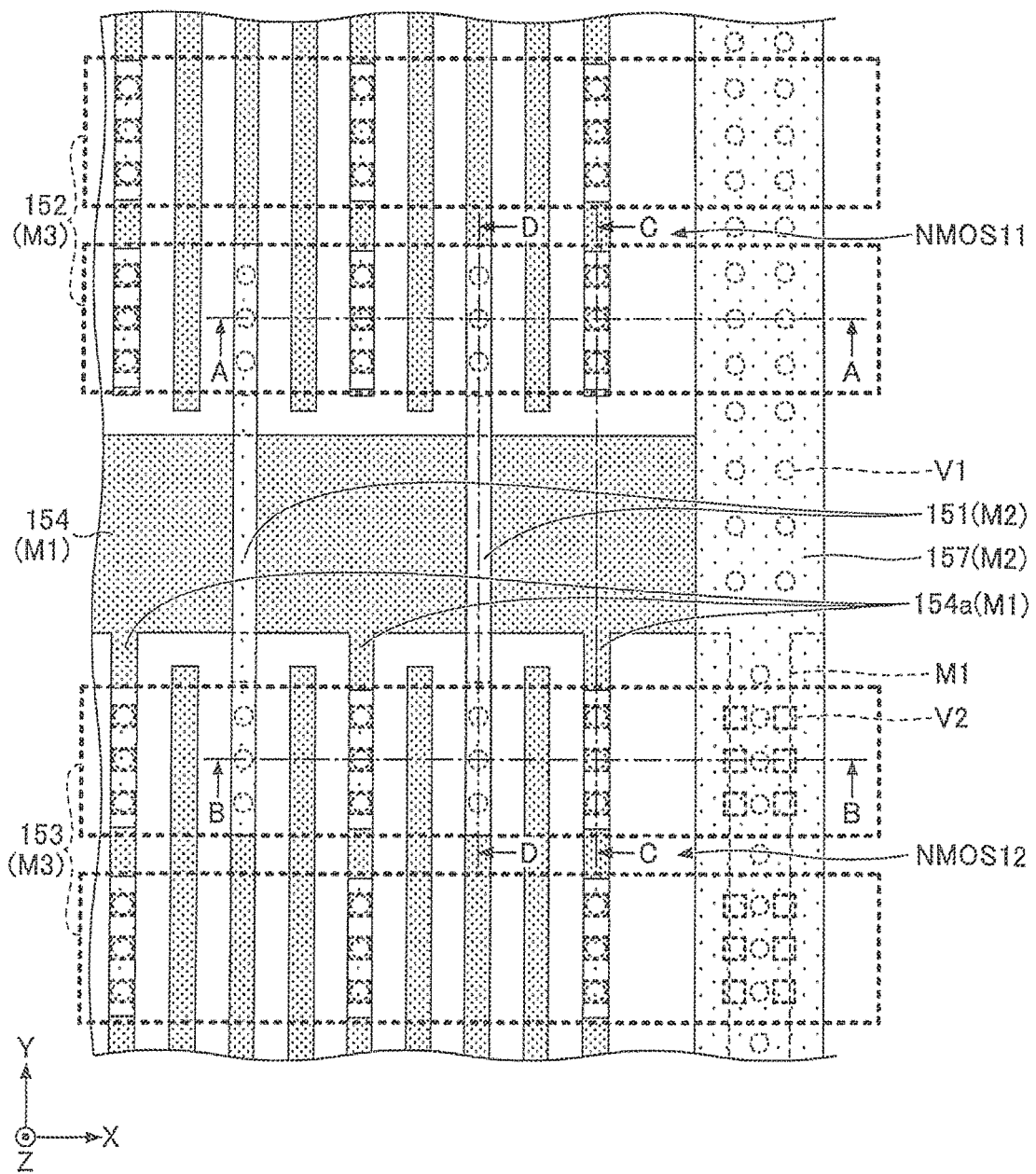
FIG. 5 is a plan view illustrating the metal wiring layer M1 up to a metal wiring layer M3 of the semiconductor device in the first embodiment.

FIG. 4 is a plan view (part 1) of a part A in FIG. 3, illustrating the substrate up to a metal wiring layer M1. FIG. 5 is a plan view (part 2) of the part A in FIG. 3, illustrating the metal wiring layer M1 up to a metal wiring layer M3.

Figure 6:
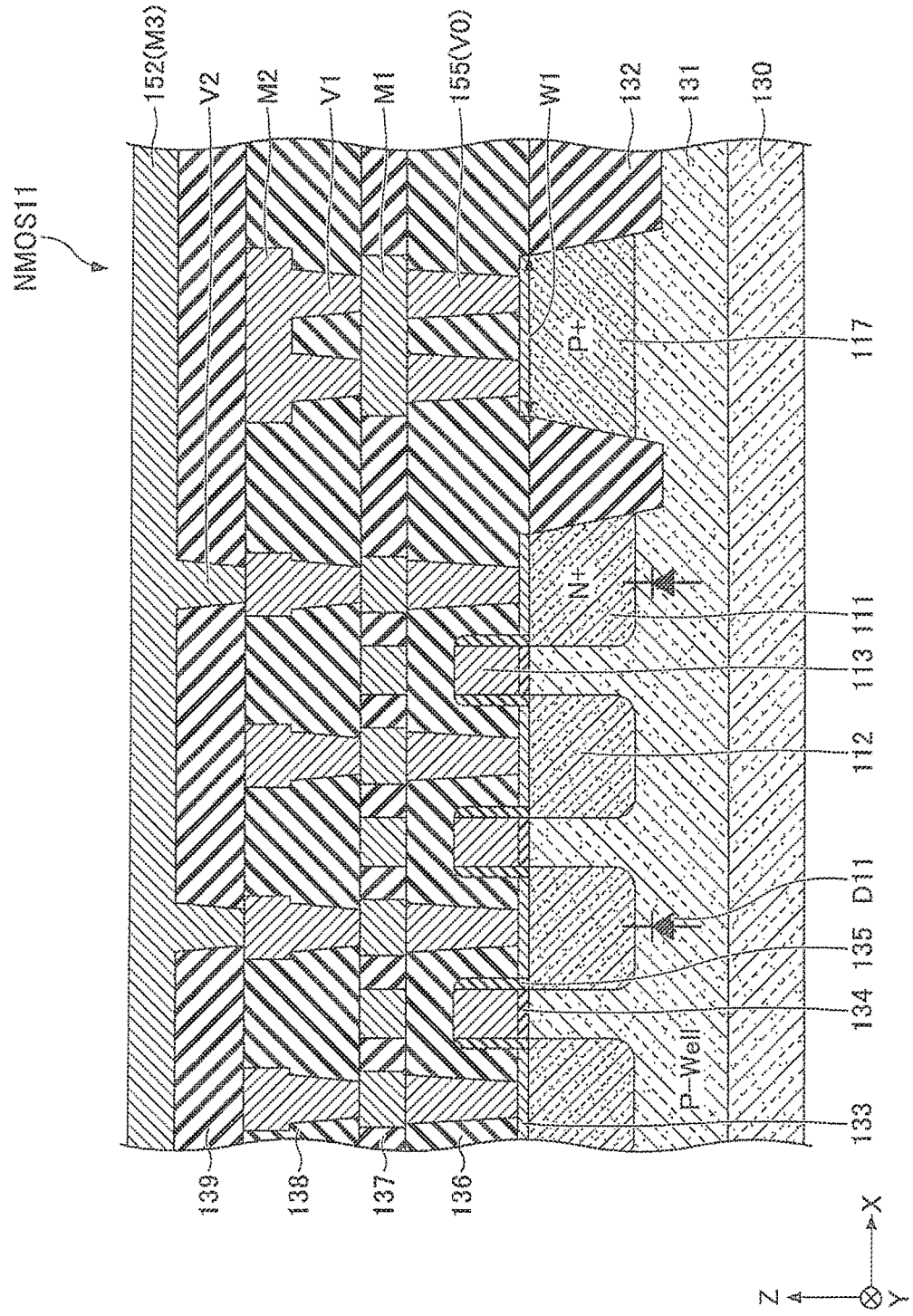
FIG. 6 is a cross sectional view along a line A-A in FIG. 4 and FIG. 5.
Figure 7:
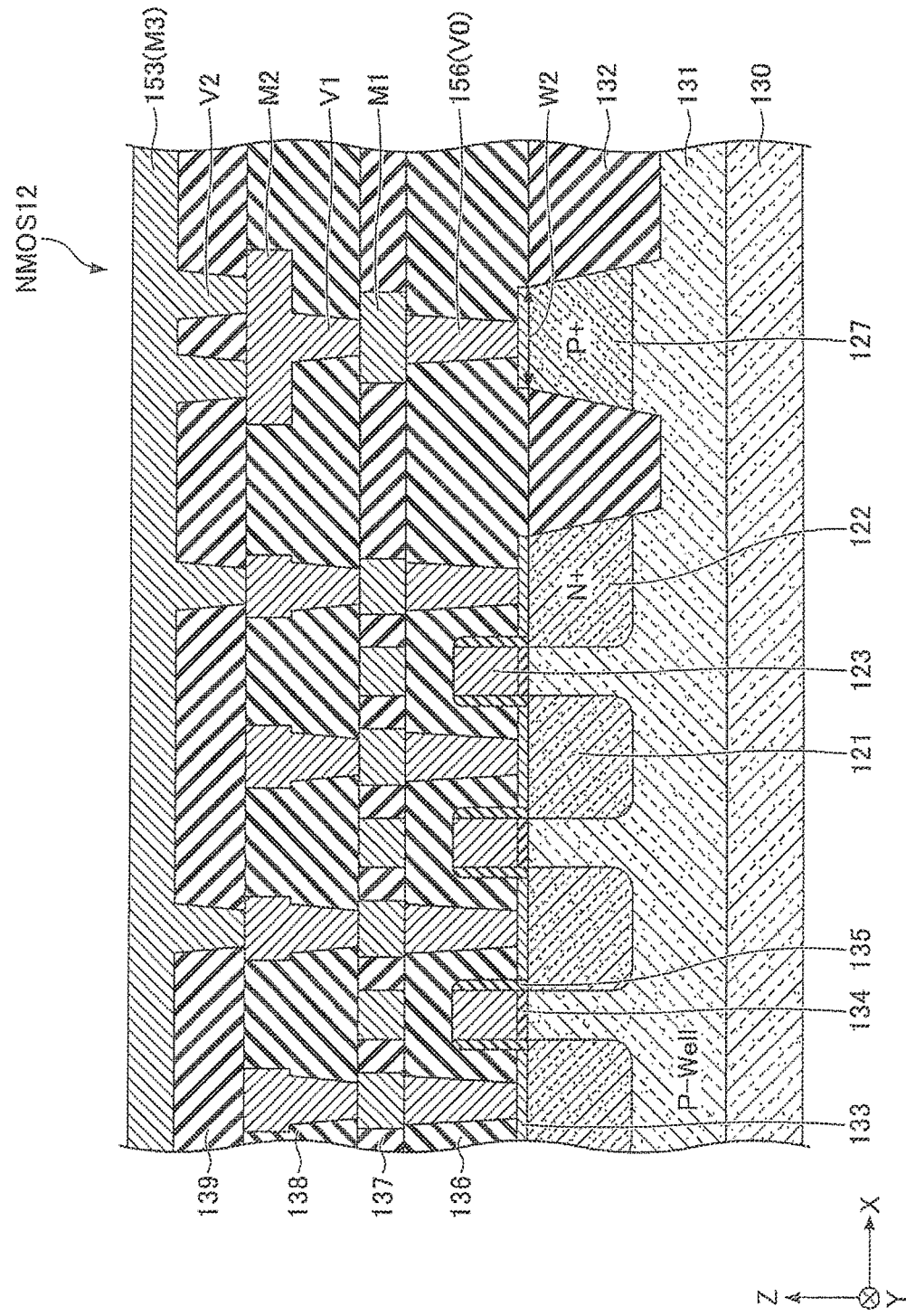
FIG. 7 is a cross sectional view along a line B-B in FIG. 4 and FIG. 5.
Figure 8:
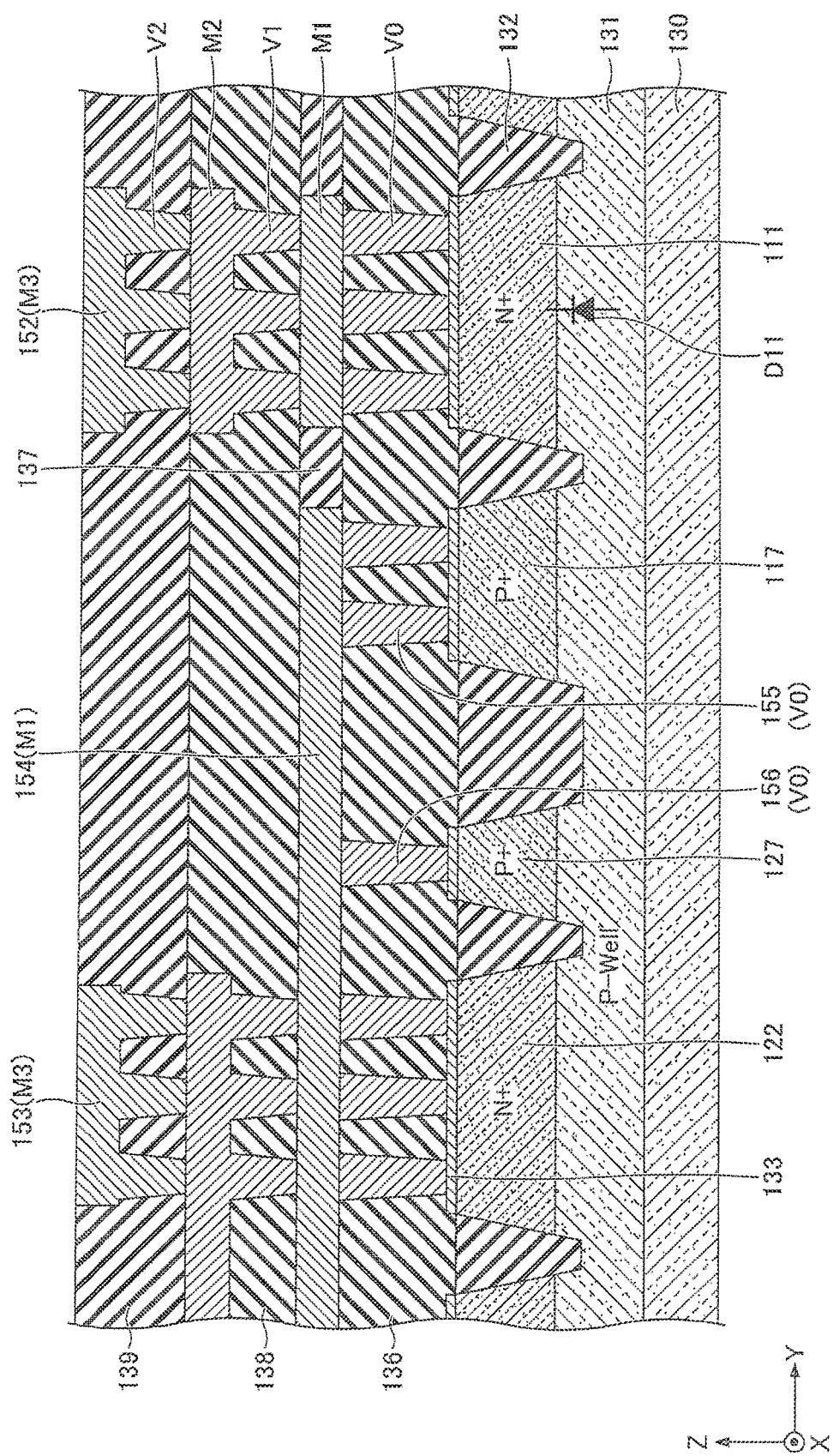
FIG. 8 is a cross sectional view along a line C-C in FIG. 4 and FIG. 5.
Figure 9:
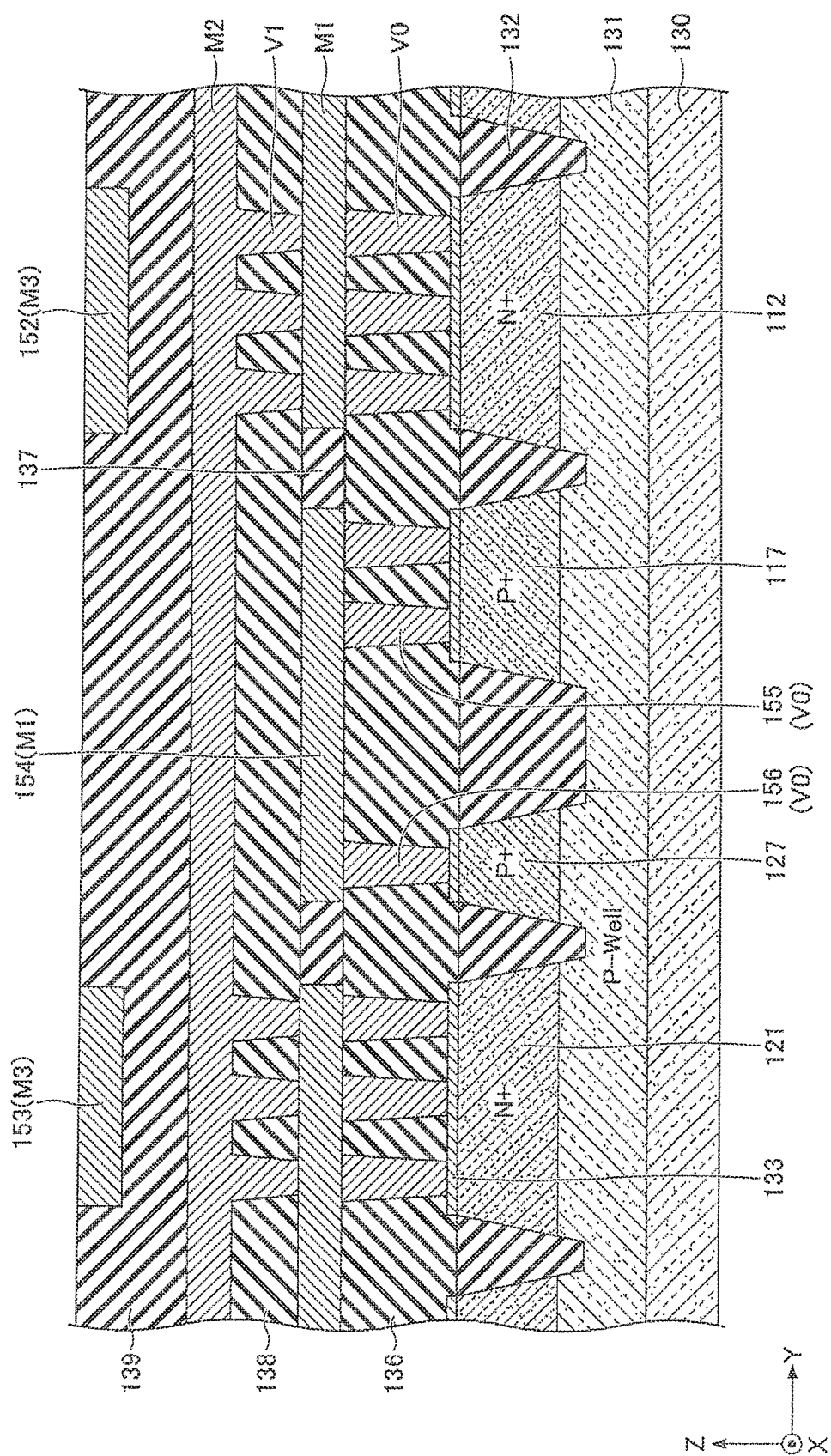
FIG. 9 is a cross sectional view along a line D-D in FIG. 4 and FIG. 5.

FIG. 6 is a cross sectional view along a line A-A in FIG. 4 and FIG. 5. FIG. 7 is a cross sectional view along a line B-B in FIG. 4 and FIG. 5. FIG. 8 is a cross sectional view along a line C-C in FIG. 4 and FIG. 5. FIG. 9 is a cross sectional view along a line D-D in FIG. 4 and FIG. 5.

As illustrated in FIG. 4 through FIG. 9, a P-well 131 including a P-type impurity, STIs (Shallow Trench Isolations) 132, the N-type first impurity regions 111, the N-type second impurity regions 112, the N-type third impurity regions 121, the N-type fourth impurity regions 122, the P-type guard ring 117, the P-type guard ring 127, or the like are formed on a substrate 130 of the semiconductor device 1. The substrate 130 is made of an N-type semiconductor. In a case in which the substrate 130 is made of a P-type semiconductor, the formation of the P-well 131 may be omitted.

A silicide layer 133 made of nickel-silicide, cobalt-silicide, or the like, for example, is formed on surfaces of the first impurity regions 111 and the second impurity regions 112, the third impurity regions 121 and the fourth impurity regions 122, and the guard ring 117 and the guard ring 127. The STI 132 is formed by a silicon oxide layer, for example. In FIG. 6 through FIG. 9, "P+" indicates a region having a higher P-type impurity concentration than the P-well, and "N*" indicates a region having a higher N-type impurity concentration than a N-well.

In a region between the first impurity region 111 and the second impurity region 112 on the substrate 130, a gate electrode 113 is formed through a gate insulator layer 134. In addition, in a region between the third impurity region 121 and the fourth impurity region 122 on the substrate 130, a gate electrode 123 is formed through the gate insulator layer 134. The gate electrode 113 and the gate electrode 123 may be formed by polysilicon, for example. The gate electrode 113 and the gate electrode 123 may be formed by a metal, such as titanium nitride, or the like. The gate insulator layer 134 may be formed by a silicon oxide layer, for example. The gate insulator layer 134 may be include an oxide of any of hafnium, zirconium, lanthanum, yttrium, aluminum, titanium, and tantalum.

A spacer layer 135 made of a silicon oxide layer, a silicon nitride layer, or the like, for example, is provided on side surfaces of the gate insulator layer 134 and the gate electrode 113, and on side surfaces of the gate insulator layer 134 and the gate electrode 123. The silicide layer 133, the spacer layers 135, the gate electrode 113, and the gate electrode 123 are covered by an interlayer insulator 136.

The metal wiring layer M1 is connected to the first impurity regions 111 and the second impurity regions 112, the third impurity regions 121 and the fourth impurity regions 122, the guard ring 117 and the guard ring 127, or the like through the vias V0 provided in the interlayer insulator 136. Side surfaces of the metal wiring layer M1 are covered by an interlayer insulator 137. A top surface of the metal wiring layer M1 is covered by an interlayer insulator 138.

The metal wiring layer M2 is connected to the metal wiring layer M1 through vias V1 provided in the interlayer insulator 138. Side surfaces of the metal wiring layer M2 are covered by the interlayer insulator 138. A top surface of the metal wiring layer M2 is covered by an interlayer insulator 139. The metal wiring layer M3 is connected to the metal wiring layer M2 through vias V2 provided in the interlayer insulator 139. Side surfaces of the metal wiring layer M3 are covered by the interlayer insulator 139.

The metal wiring layers M1, M2, and M3, and the vias V1 and V2 may be formed by a barrier metal layer of tantalum or tantalum nitride, copper, or the like, for example. The vias V0 may be formed by a glue layer of titanium nitride, a tungsten layer, or the like, for example. The metal wiring layer M1 may have a single damascene structure, for example. The metal wiring layer M2 and the vias V1 may have a dual damascene structure, for example. The metal wiring layer M3 and the vias V2 may have a dual damascene structure, for example.

The interlayer insulator 136 may be formed by a silicon oxide layer, or the like, for example. The interlayer insulators 137, 138, and 139 may be formed by a low dielectric constant material (or low-k material) such as SiOC (carbon-doped silicon oxide), a porous layer, or the like, for example.

The wirings 154 may be included in the metal wiring layer M1. The VDD wirings 152 and the VSS wirings 153 may be included in the metal wiring layer M3. In addition, the VDD wirings 152 and the VSS wirings 153 may be formed in a metal wiring layer other than the metal wiring layer M3, and may be formed in the metal wiring layer that is provided above the metal wiring layer M3, for example. In addition, the vias 155 and the vias 156 may be included in the vias V0. A more detailed description will be given in conjunction with FIG. 4 through FIG. 9.

As illustrated in FIG. 4, the width W1 of the guard ring 117 surrounding the NMOSs 11 is wider than the width W2 of the guard ring 127 surrounding the NMOSs 12. In addition, the number of vias 155 connecting the wirings 154 (metal wiring layer M1) and the guard ring 117 is greater than the number of vias 156 connecting the wirings 154 and the guard ring 127.

In the description of FIG. 4, a difference in the number of vias 155 connecting the wiring 154 and the guard ring 117 and the number of vias 156 connecting the wiring 154 and the guard ring 127 is compared by the number of vias arranged in the width direction (that is, in the direction of the width) of the guard ring. In other words, the numbers of vias arranged in the X-direction are compared at a position of the guard ring extending in the Y-direction, and the number of vias arranged in the Y-direction are compared at a position of the guard ring extending in the X-direction.

In the example illustrated in FIG. 4, the number of vias 155 connecting the wiring 154 and the guard ring 117 is two, at both the position of the guard ring extending in the Y-direction and the position of the guard ring extending in the X-direction. The number of vias 156 connecting the wiring 154 and the guard ring 127 is one, at both the position of the guard ring extending in the Y-direction and the position of the guard ring extending in the X-direction. In other words, the number of vias 155 connecting the wiring 154 and the guard ring 117 is greater than the number of vias 156 connecting the wiring 154 and the guard ring 127, at both the position of the guard ring extending in the Y-direction and the position of the guard ring extending in the X-direction. The number of vias 155 and the number of vias 156 are not limited to the numbers described above. For example, three or more vias 155 may be arranged, and one via 156 may be arranged, as long as the number of vias 156 is smaller than the number of vias 155.

In addition, as illustrated in FIG. 4, a width of the wiring 154 overlapping the guard ring 117 in a plan view is wider than a width of the wiring 154 overlapping the guard ring 127 in a plan view. Hence, the electrical resistance of the part of the wiring 154 provided on the guard ring 117 becomes lower than the electrical resistance of the part of the wiring 154 provided on the guard ring 127. For this reason, the ESD current more easily flows towards the guard ring 117 through the part of the wiring 154 provided on the guard ring 117, and through the parasitic diode D11 that is formed by the guard ring 117 of the NMOS 11 and the first impurity region 111 of the NMOS 11. The ESD current also more easily flows towards the VDD wiring 152, as illustrated in FIG. 5.

As illustrated in FIG. 4, the wiring 154 includes wiring parts 154a that branch from the wiring 154. The wiring parts 154a are arranged to partially overlap the NMOSs 12, and connect to the fourth impurity region 122 through the vias V0.

As illustrated in FIG. 3 and FIG. 4, the first impurity region 111 that electrically connects to the VDD wiring 152 may be arranged at a position closer to the guard ring 117 than the second impurity region 112.

As illustrated in FIG. 5, the VDD wirings 152 of the metal wiring layer M3 are arranged on the NMOSs 11 and on the guard ring 117, and the VSS wirings 153 are arranged on the NMOSs 12 and on the guard ring 127. However, this arrangement is merely an example. The VSS wirings 153 may be arranged on the NMOSs 11 and on the guard ring 117, and the VDD wirings 152 may be arranged on the NMOSs 12 and on the guard ring 127. The VDD wirings 152 and the VSS wirings 153 are connected to the metal wiring layer M2 underneath, through the vias V2 indicated by dotted rectangular marks on the guard ring 127.

The VDD wirings 152 and the VSS wirings 153 may be formed in a layer above the metal wiring layer M3. In addition, wirings for supplying a power supply potential or a ground potential to a circuit, such as the protected circuit C12, or the like, for example, may be arranged on the metal wiring layer M3.

Further, as illustrated in FIG. 5, a wiring 157, that electrically connects to the wirings 154 and the VSS wirings 153, is arranged on the metal wiring layer M2. The wiring 157 may be arranged to surround both the NMOSs 11 and the NMOSs 12 in a plan view, on the guard ring 117 and the guard ring 127. The number of vias V1 connecting the wiring 157 and the wiring 154, arranged in the width direction of the guard ring 117, is greater than the number of vias V1 arranged in the width direction of the guard ring 127. Hence, an electrical resistance between the wiring 157 and the guard ring 117 can be reduced compared to an electrical resistance between the wiring 157 and the guard ring 127. As a result, the ESD current more easily flows towards the power supply terminal VDD, through the guard ring 117 and the parasitic diode D11.

In addition, as illustrated in FIG. 5 and FIG. 6, the wirings of the metal wiring layer M2 provided on the first impurity regions 111 of the NMOSs 11 are connected to the VDD wirings 152 of the metal wiring layer M3, through the vias V2. Moreover, as illustrated in FIG. 5 and FIG. 7, the wirings of the metal wiring layer M2 provided on the fourth impurity regions 122 of the NMOSs 12 are connected to the VSS wirings 153 of the metal wiring layer M3, through the vias V2.

As illustrated in FIG. 5 and FIG. 9, the second impurity regions 112 of the NMOS 11 and the third impurity regions 121 of the NMOS 12 are electrically connected through the wirings 151 of the metal wiring layer M2 extending in the Y-direction. The wirings 151 of the metal wiring layer M2 are arranged to traverse the wirings 154 of the metal wiring layer M1 provided on the guard rings 117 and 127 extending in the X-direction.

As illustrated in FIG. 8, the wirings of the metal wiring layer M1, that connect to the fourth impurity regions 122 of the NMOSs 12, are connected to the wirings of the metal wiring layer M1 covering the guard rings 117 and 127. The first impurity regions 111 of the NMOSs 11 are connected to the VDD wirings 152 of the metal wiring layer M3.

According to the semiconductor device 1 in the first embodiment, the width W1 of the guard ring 117 surrounding the NMOSs 11 is wider than the width W2 of the guard ring 127 surrounding the NMOSs 12. Hence, the resistance of the guard ring 117 is lower than the resistance of the guard ring 127. As a result, it is possible to cause the ESD current to more easily flow from the guard ring 117 towards the power supply terminal VDD through the parasitic diode D11, and improve the protection capability against the ESD surge with respect to the protected circuit C12.

The number of vias 155 arranged on the guard ring 117 may be made greater than the number of vias 156 arranged on the guard ring 127. In this case, it is possible to reduce the electrical resistance between the ground terminal VSS and the guard ring 117 compared to the electrical resistance between the ground terminal VSS and the guard ring 127, and cause the ESD current to even more easily flow towards the power supply terminal VDD.

The width of the wiring 154 overlapping the guard ring 117 in a plan view may be made wider than the width of the wiring 154 overlapping the guard ring 127 in a plan view. In this case, it is possible to cause the ESD current to more easily flow to the guard ring 117 through the parasitic diode D11 that is formed by the guard ring 117 of the NMOSs 11 and the first impurity region 111 of the NMOSs 11, and further, to more easily flow to the VDD wiring 152.

The first impurity region 111 is preferably arranged at a position closer to the guard ring 117 than the second impurity region 112. In this case, it is possible to cause the ESD current to even more easily flow to the guard ring 117, through the parasitic diode D11 that is formed by the guard ring 117 of the NMOSs 11 and the first impurity region 111 of the NMOSs 11.

First Modification of First Embodiment

A first modification of the first embodiment illustrates an example in which the semiconductor device 1 includes Fin FETs, namely, FETs including fin-shaped channels. In the first modification of the first embodiment, a description of the same constituent elements that have been described above may be omitted.

Figure 10:
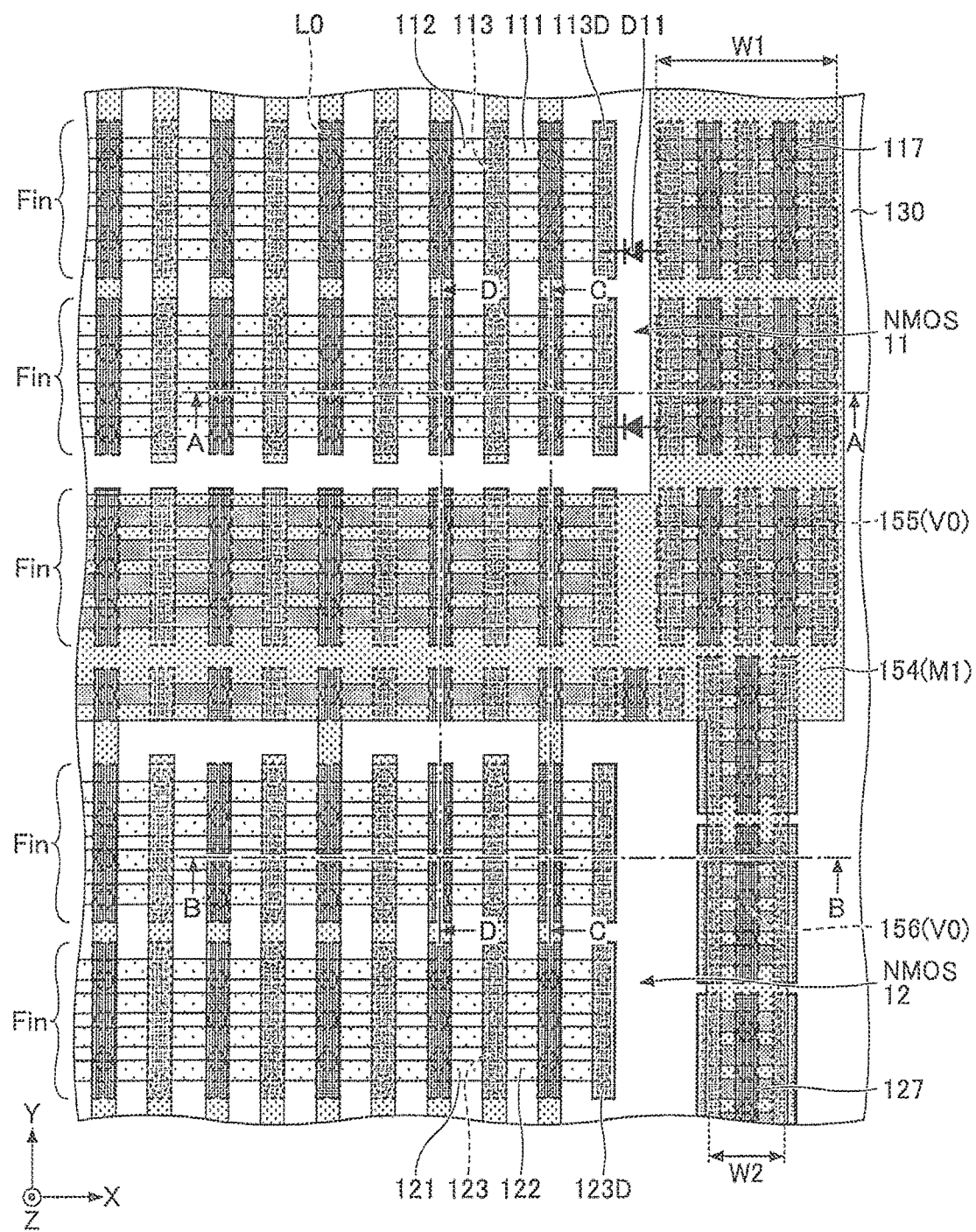
FIG. 10 is a plan view illustrating the substrate up to the metal wiring layer M1 of the semiconductor device in a first modification of the first embodiment.
Figure 11:
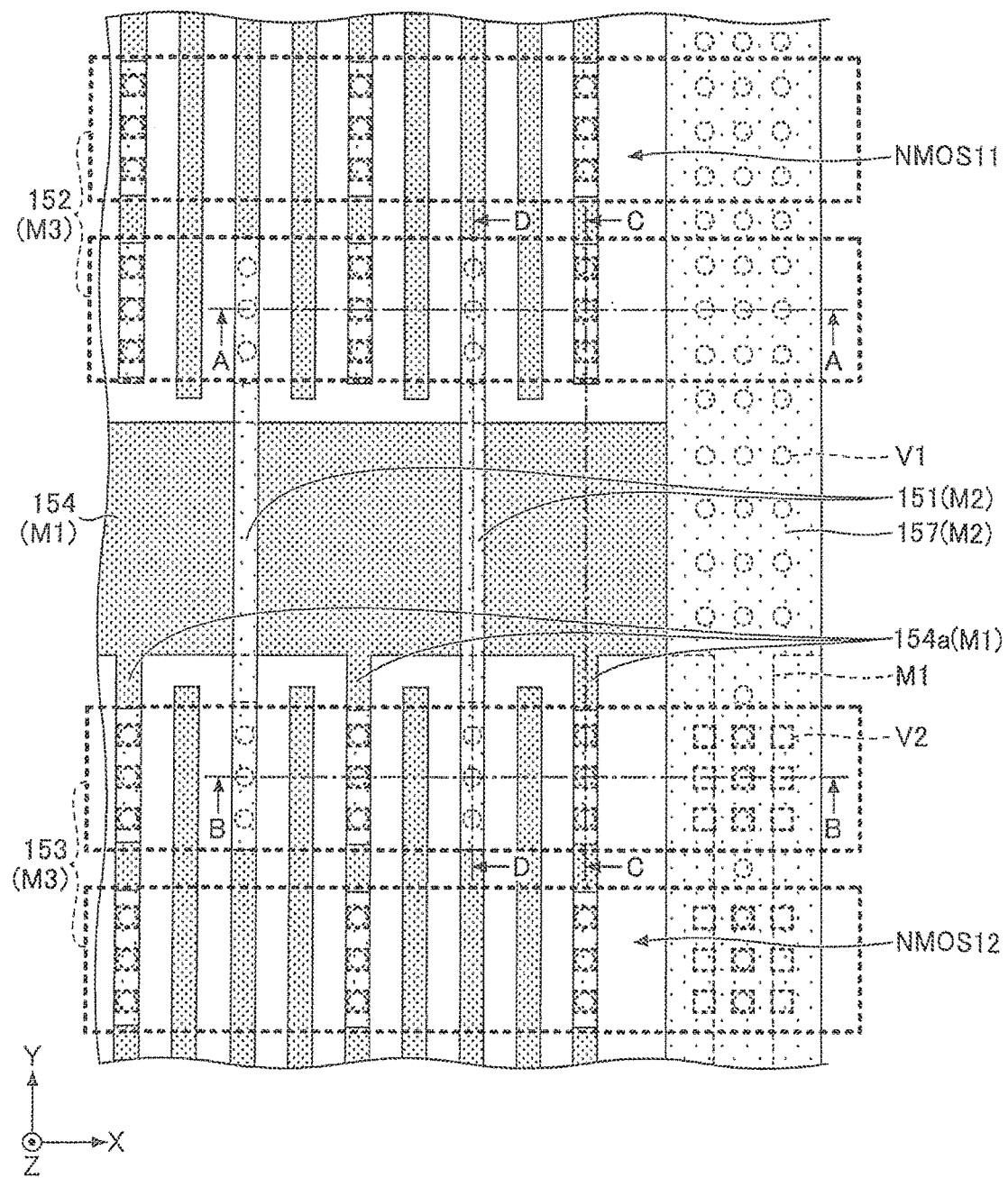
FIG. 11 is a plan view illustrating the metal wiring layer M1 up to the metal wiring layer M3 of the semiconductor device in the first modification of the first embodiment.
Figure 12:
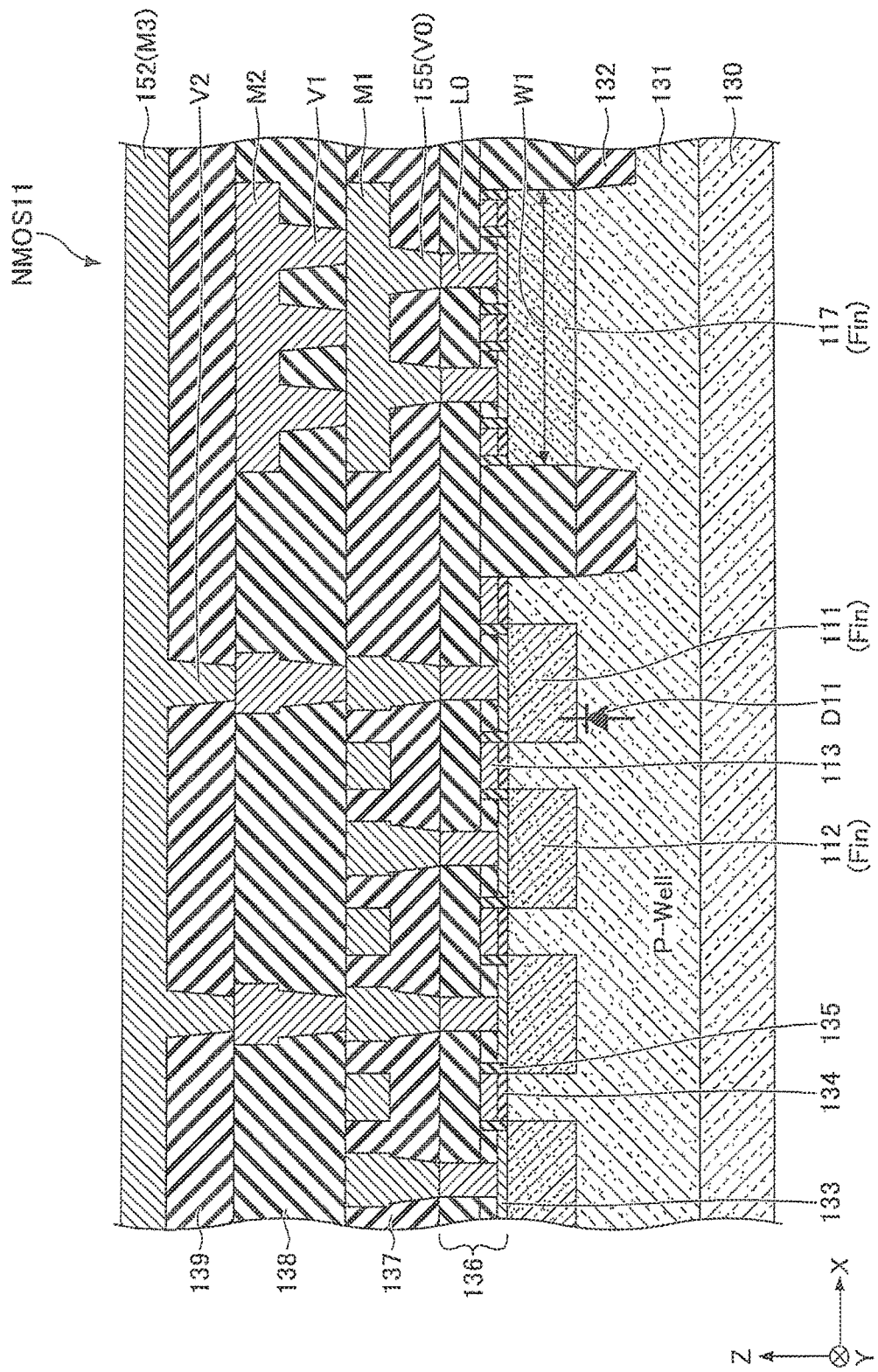
FIG. 12 is a cross sectional view along a line A-A in FIG. 10 and FIG. 11.
Figure 13:
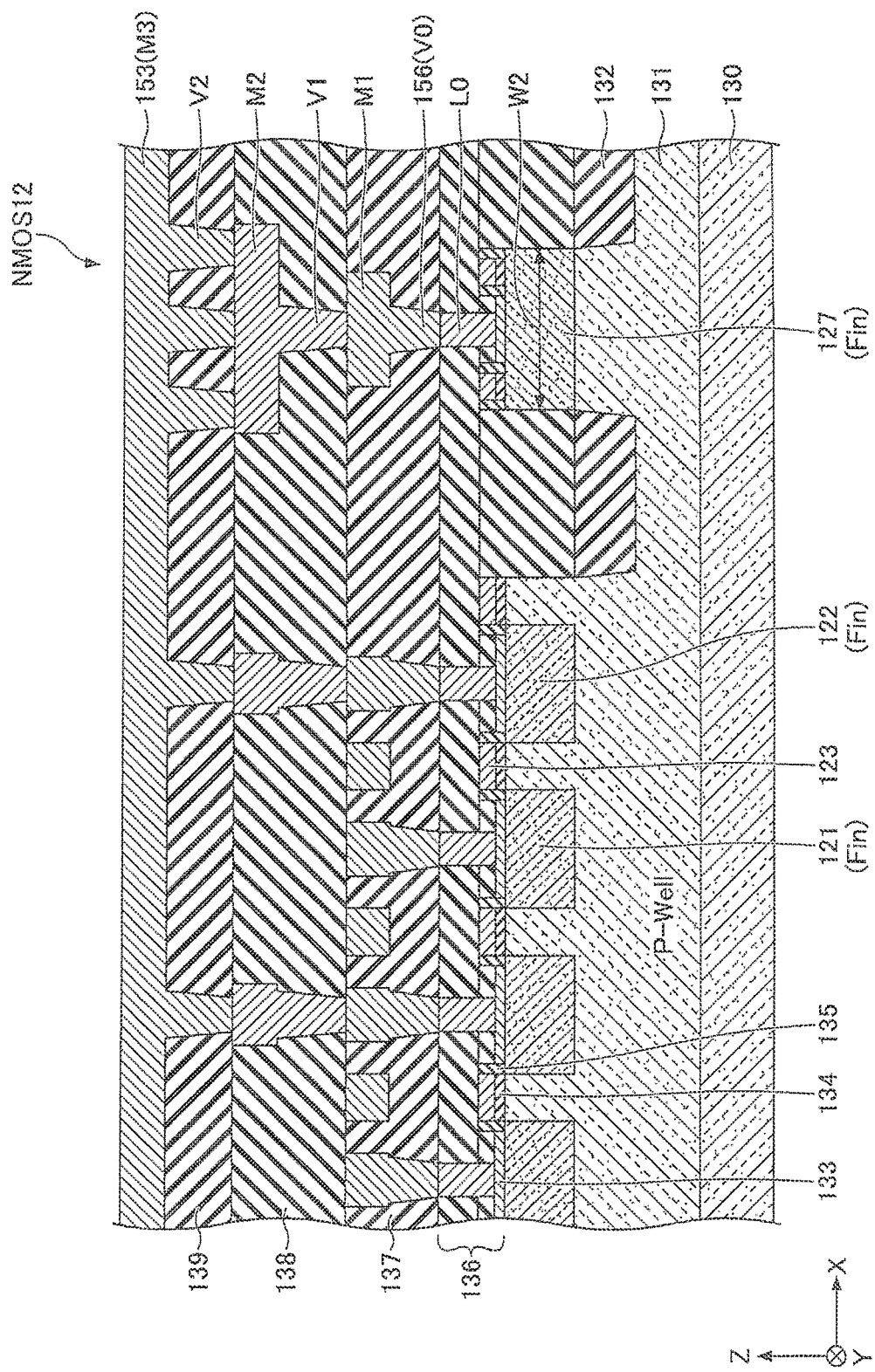
FIG. 13 is a cross sectional view along a line B-B in FIG. 10 and FIG. 11.
Figure 14:
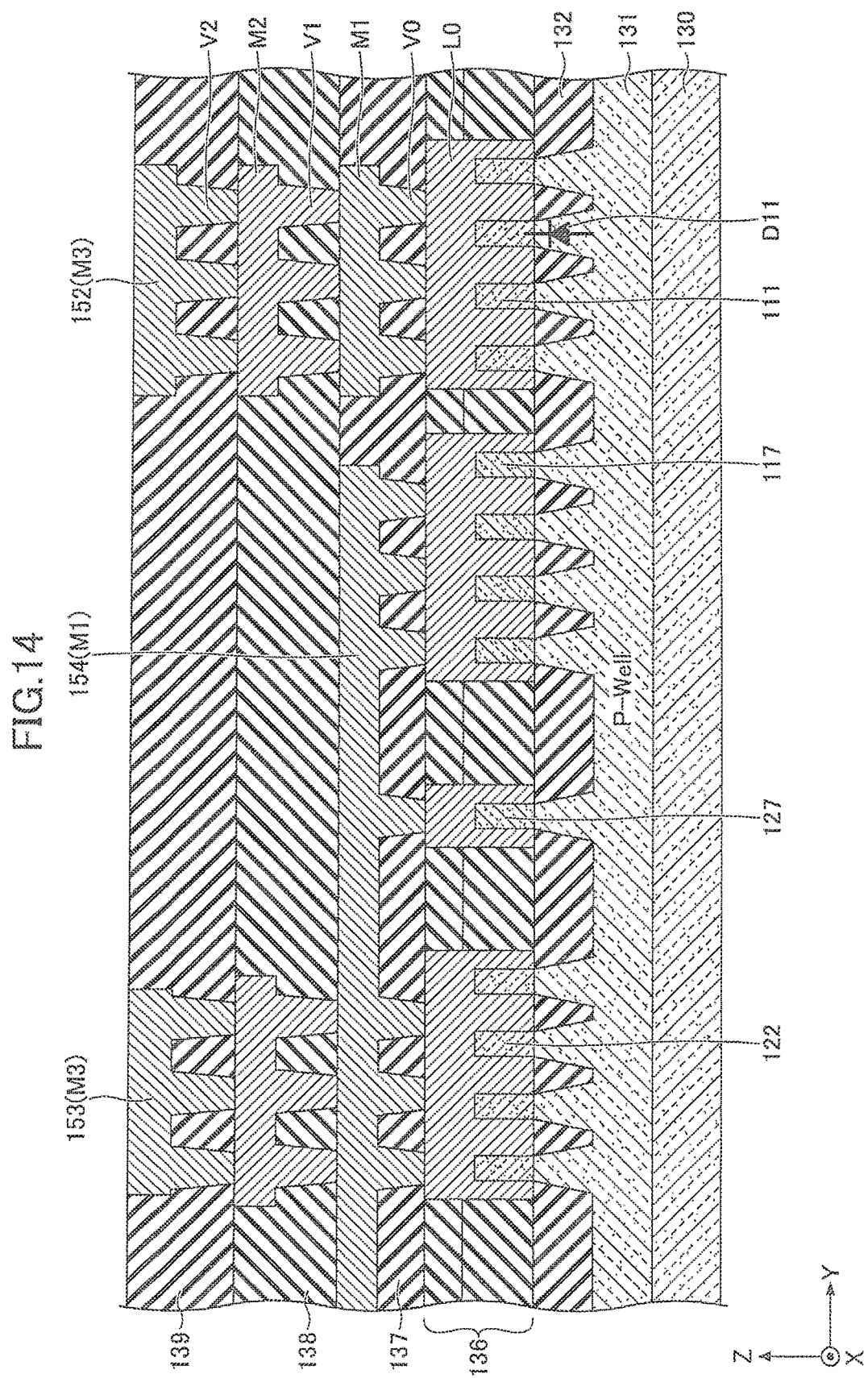
FIG. 14 is a cross sectional view along a line C-C in FIG. 10 and FIG. 11.
Figure 15:
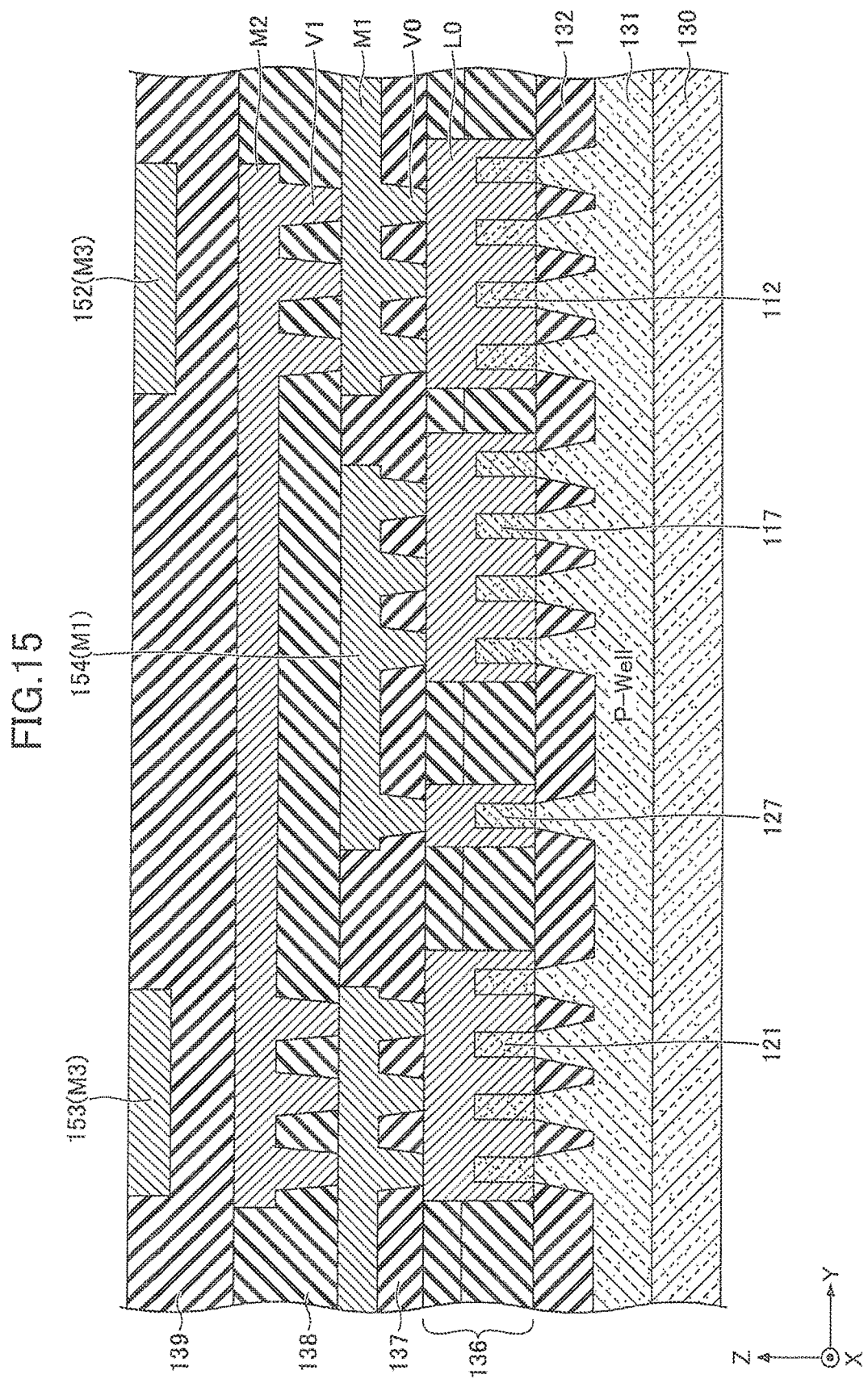
FIG. 15 is a cross sectional view along a line D-D in FIG. 10 and FIG. 11.

FIG. 10 is a plan view corresponding to FIG. 4, illustrating the substrate up to the metal wiring layer M1. FIG. 11 is a plan view corresponding to FIG. 5, illustrating the metal wiring layer M1 up to the metal wiring layer M3. FIG. 12 is a cross sectional view along a line A-A in FIG. 10 and FIG. 11. FIG. 13 is a cross sectional view along a line B-B in FIG. 10 and FIG. 11. FIG. 14 is a cross sectional view along a line C-C in FIG. 10 and FIG. 11. FIG. 15 is a cross sectional view along a line D-D in FIG. 10 and FIG. 11.

As illustrated in FIG. 10, the basic arrangement is the same as the arrangement of FIG. 4, from the substrate 130 up to the metal wiring layer M1.

However, in the case in which the semiconductor device 1 includes the Fin FETs, unlike the case in which the semiconductor device 1 includes the planar FETs, a plurality of fins extending in the X-direction are arranged along the Y-direction in each of the NMOS 11 and the NMOS 12. In addition, the gate electrodes 113 and 123, and a local wiring L0 are formed to traverse the plurality of fins in the Y-direction.

In FIG. 10, dummy gate electrode structures 113D and 123D are formed at terminal ends of the fin. However, the dummy gate electrode structures 113D and 123D are not essential, and the dummy gate electrode structures 113D and 123D may be omitted.

The guard rings 117 and 127 may be formed by fins. In the case in which the semiconductor device 1 includes the planar FETs, one guard ring 117 and one guard ring 127 are provided, as illustrated in FIG. 4, for example. On the other hand, in the case in which the semiconductor device 1 includes the Fin FETs, a group of isolated fins forms the guard ring 117, and a group of isolated fins forms the guard ring 127. In FIG. 10, the difference between the width W1 of the guard ring 117 in the X-direction and the width W2 of the guard ring 127 in the X-direction corresponds to a difference between the widths of the fins. In addition, the difference between the width of the guard ring 117 in the Y-direction and the width of the guard ring 127 in the Y-direction corresponds to the difference between the numbers of fins. Between the NMOS 11 and the NMOS 12, the number of fins forming the guard ring 117 is greater than the number of fins forming the guard ring 127.

In the example illustrated in FIG. 10, the number of fins of the NMOS 11, the NMOS 12, and the guard ring 117 is four, however, the number of fins may be one, or two or more but other than four. With regard to the guard ring 127 positioned at a part between the NMOS 11 and the NMOS 12 in a plan view, the number of fins is not limited to one, and may be two or more but less than the number of fins at the guard ring 117.

As illustrated in FIG. 11, from the metal wiring layer M1 up to the metal wiring layer M3, the basic arrangement is the same as the arrangement of FIG. 5. In the example illustrated in FIG. 11, the number of vias connecting the wiring 154 and the guard ring 117 is three at the position of the guard ring extending in the Y-direction. However, in a case in which the number of vias connecting the wiring 154 and the guard ring 117 at the position of the guard ring extending in the Y-direction is greater than the number of vias connecting the wiring 154 and the guard ring 127 at the position of the guard ring extending in the Y-direction, the number of vias connecting the wiring 154 and the guard ring 117 at the position of the guard ring extending in the Y-direction may be two as in the case illustrated in FIG. 5, or four or more.

In the example illustrated in FIG. 11, the VDD wirings 152 and the VSS wirings 153 are formed in the metal wiring layer M3. However, the VDD wirings 152 and the VSS wirings 153 may be formed in the metal wiring layer that is provided above the metal wiring layer M3, for example. Similarly, the wirings of the metal wiring layer M2 connecting the NMOSs 11 and the NMOSs 12 may be formed in the metal wiring layer that is provided above the metal wiring layer M2. In other words, the metal wiring layer in which each wiring is formed may be freely changed in the first modification of the first embodiment, and in the other embodiments and modifications described in this specification.

As illustrated in FIG. 12 and FIG. 13, the fins are formed by patterning the semiconductor substrate, for example. The impurity regions corresponding to the source and the drain of each transistor are formed by ion implantation to the fins. The fins and the wirings of the metal wiring layer M1 are connected through the local wiring L0 and the vias V0 on the local wiring L0. In addition, the gate electrodes 113 and 123 have parts on which the local wiring L0 is formed, and the vias V0 and the metal wiring layer M1 are formed on these parts, although the illustration thereof will be omitted. The vias V0 and the wirings of the metal wiring layer M1 may have the dual damascene structure, for example. In this case, the vias V0 and the wirings of the metal wiring layer M1 may be formed by a barrier metal layer of tantalum or tantalum nitride, copper, or the like, for example. Further, the local wiring L0 may be formed by a glue layer of titanium nitride, a tungsten layer, or the like, for example.

As illustrated in FIG. 14 and FIG. 15, from the metal wiring layer M1 up to the metal wiring layer M3, the basic cross sectional structures are the same as the cross sectional structures of FIG. 8 and FIG. 9. However, unlike the case in which the semiconductor device 1 includes the planer FETs, the parts forming the source and the drain of the transistor are included in a fin shape projecting from the substrate 130. The number (four in the example illustrated) of guard rings 117 at the part extending in the X-direction is greater than the number (one in the example illustrated) of guard rings 127 at the part extending in the X-direction.

Accordingly, even in the case in which the semiconductor device 1 includes the Fin FETs, the widths W1 and W2 may be made different in a manner similar to the first embodiment, so that it is possible to cause the ESD current to more easily flow from the guard ring 117 towards the power supply terminal VDD through the parasitic diode D11, and improve the protection capability against the ESD surge with respect to the protected circuit C12.

Similarly as in the case of the first embodiment, the number of vias 155 arranged on the guard ring 117 may be greater than the number of vias 156 arranged on the guard ring 127. In addition, similarly as in the case of the first embodiment, the width of the wiring 154 overlapping the guard ring 117 in a plan view may be wider than the width of the wiring 154 overlapping the guard ring 127 in a plan view. Further, similarly as in the case of the first embodiment, the first impurity region 111 may be arranged at the position closer to the guard ring 117 than the second impurity region 112. Similarly as in the case of the first embodiment, the number of vias V1 connecting the wiring 154 and the wiring 157 may be greater on the guard ring 117 than on the guard ring 127. In these cases, it is also possible to obtain effects similar to the effects obtainable by the first embodiment.

Second Modification of First Embodiment

A second modification of the first embodiment illustrates an example in which the semiconductor device 1 includes nanowire FETs. In the second modification of the first embodiment, a description of the same constituent elements that have been described above may be omitted.

Figure 16:
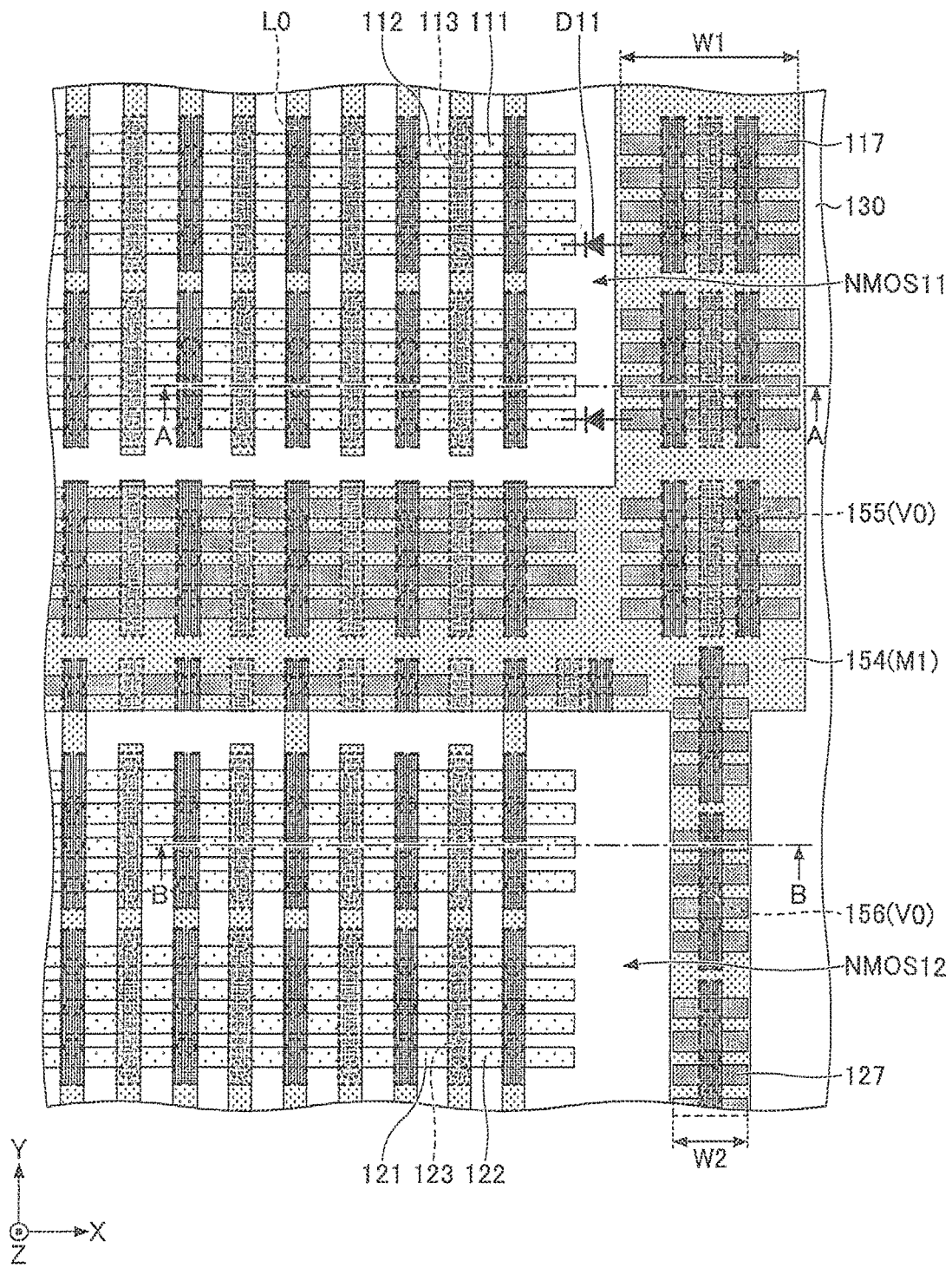
FIG. 16 is a plan view illustrating the substrate up to the metal wiring layer M1 of the semiconductor device in a second modification of the first embodiment.
Figure 17:
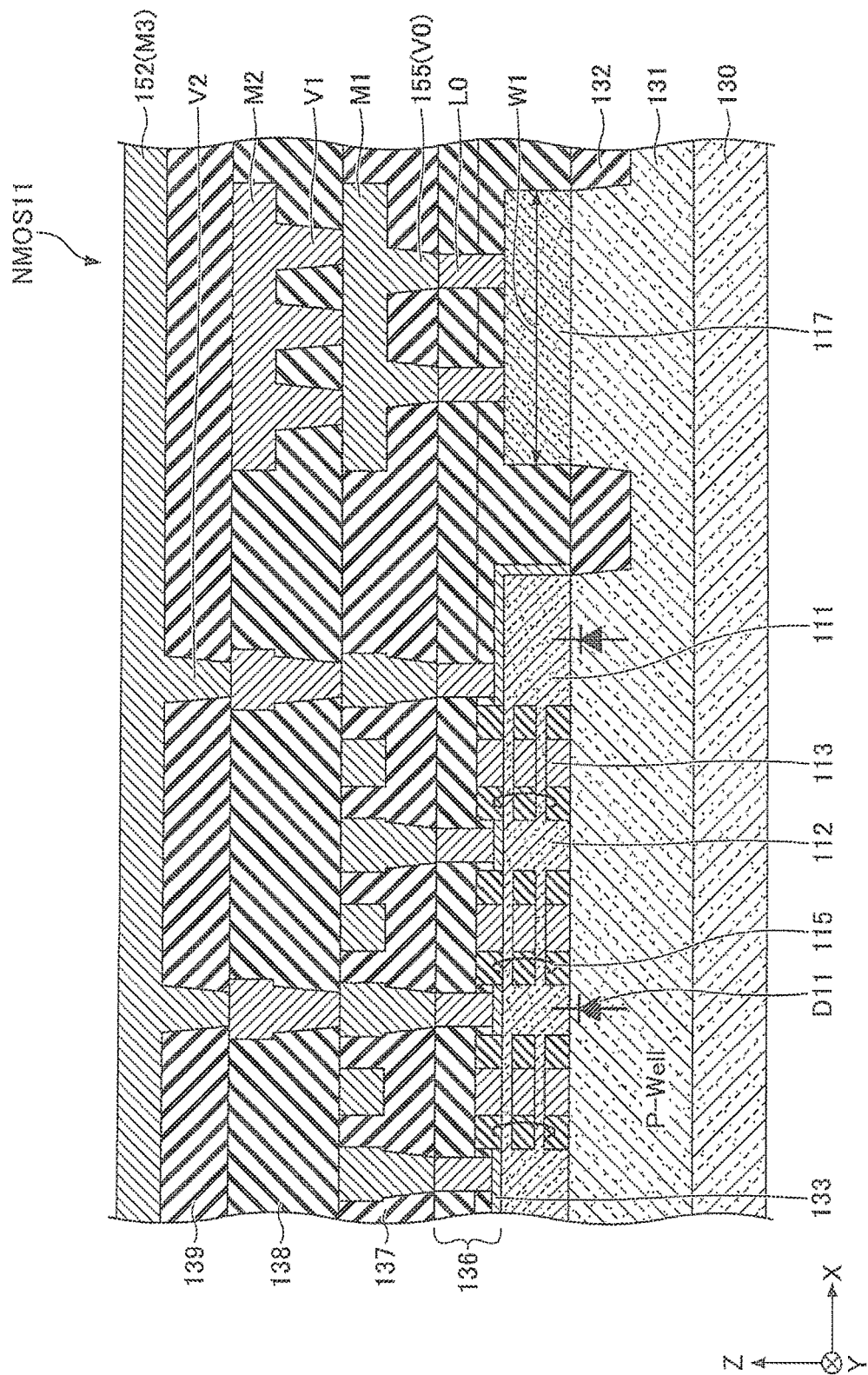
FIG. 17 is a cross sectional view along a line A-A in FIG. 16.
Figure 18:
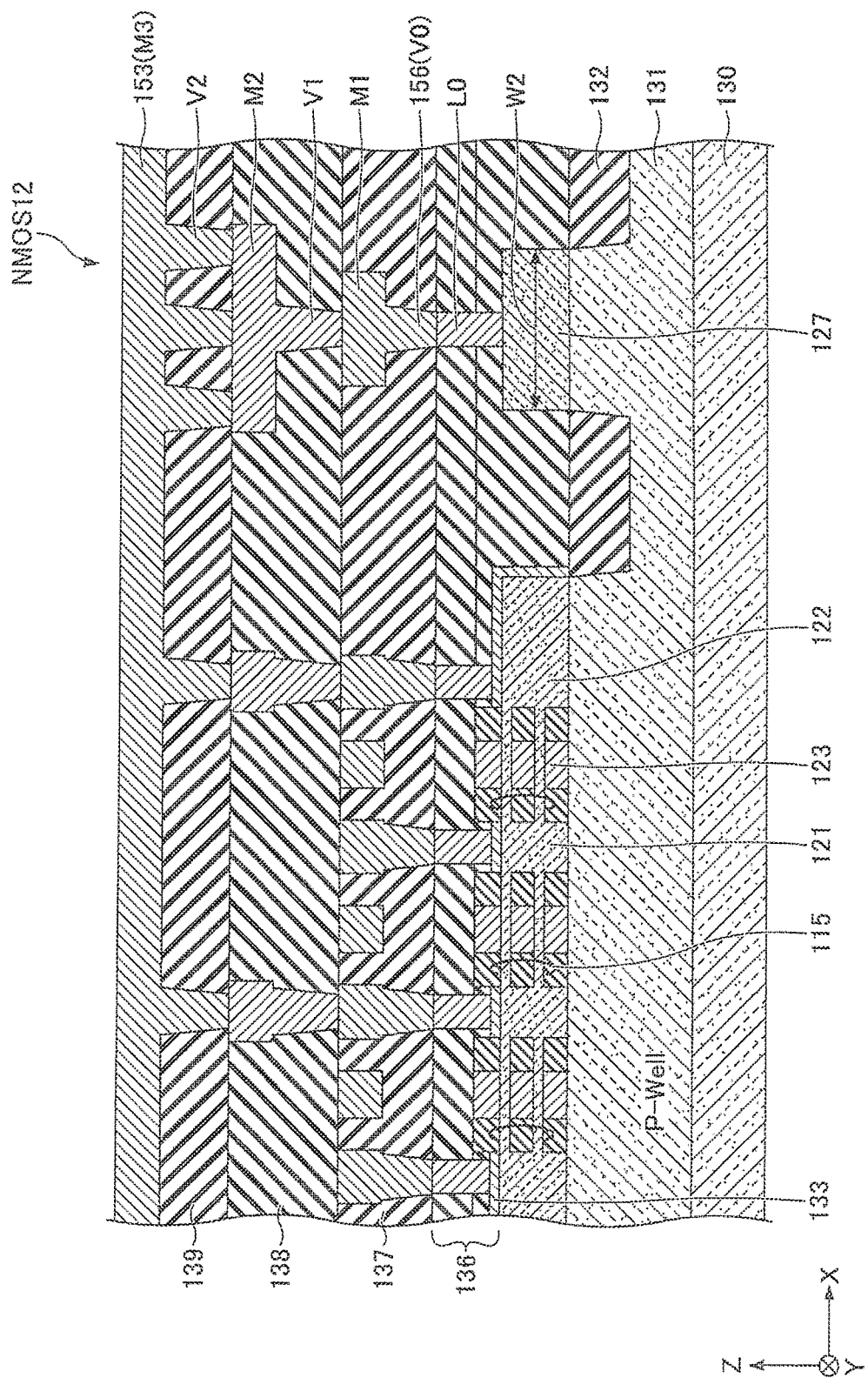
FIG. 18 is a cross sectional view along a line B-B in FIG. 16.

FIG. 16 is a plan view corresponding to FIG. 10, illustrating the substrate up to the metal wiring layer M1. FIG. 17 is a cross sectional view along a line A-A in FIG. 16. FIG. 18 is a cross sectional view along a line B-B in FIG. 16.

As illustrated in FIG. 16, the basic arrangement is the same as the arrangement of FIG. 10, from the substrate 130 up to the metal wiring layer M1.

However, in the case in which the semiconductor device 1 includes the nanowire FETs, the channel part has a wire-shape instead of the channel part of the Fin FET, and the gate insulator layer and the gate electrode are formed to surround the wire-shaped channel part. The number (four in the illustrated example) of guard rings 117 at the part extending in the X-direction is greater than the number (one in the illustrated example) of guard rings 127 at the part extending in the X-direction, similarly as in the case in which the semiconductor device includes the Fin FETs.

A nanowire 115 schematically illustrated in FIG. 17 and FIG. 18 is a thin wire through which the current flows. Both ends of the nanowire 115 are connected to a plate-shaped structure including parts that form the source region and the drain region of the nanowire FET. The nanowire 115 is formed by a semiconductor material, such as silicon, germanium, a mixture thereof, or the like, for example, and forms the channel of the transistor. The number of nanowires 115 may be determined arbitrarily. Parts of the nanowire 115 overlapping at least the gate electrodes 113 and 123 are of a conductivity type different from the conductivity type of the source and the drain, or are not implanted with impurities.

In this example, the number of nanowires 115 in the Z-direction is two. However, the number of nanowires 115 in the Z-direction may be one, or three or more. In addition, at the NMOS 11 and the NMOS 12, the number of nanowires 115 in the Y-direction is four. However, the number of nanowires 115 in the Y-direction may be one, or two or more but other than four.

In the example illustrated in FIG. 17 and FIG. 18, the parts of the guard rings 117 and 127 have a structure having no nanowires, that is, a plate-shaped structure similar to that of the Fin FET. However, the parts of the guard rings 117 and 127 may include the nanowire structure, if required. Parts that are used as transistors, not limited to the NMOS 11, the NMOS 12, the guard ring 117, and the guard ring 127, may be formed as nanowire FETs, and regions other than these parts may be formed to have the plate-shaped structure similar to that of the Fin FETs.

More particularly, in the semiconductor device including the nanowire FETs, a well tap region for supplying a potential to the substrate or the well, for example, may have the plate-shaped structure. Compared to the nanowire structure of the nanowire FET, the plate-shaped structure provides a larger area for connecting to the substrate. For this reason, compared to the case in which the structure similar to the nanowire FET is employed, the plate-shaped structure can reduce the electrical resistance at the region connecting to the substrate.

Accordingly, even in the case in which the semiconductor device 1 includes the nanowire FETs, the widths W1 and W2 may be made different in a manner similar to the first embodiment, so that it is possible to cause the ESD current to more easily flow from the guard ring 117 towards the power supply terminal VDD through the parasitic diode D11, and improve the protection capability against the ESD surge with respect to the protected circuit C12.

Similarly as in the case of the first embodiment, the number of vias 155 arranged on the guard ring 117 may be greater than the number of vias 156 arranged on the guard ring 127. In addition, similarly as in the case of the first embodiment, the width of the wiring 154 overlapping the guard ring 117 in a plan view may be wider than the width of the wiring 154 overlapping the guard ring 127 in a plan view. Further, similarly as in the case of the first embodiment, the first impurity region 111 may be arranged at the position closer to the guard ring 117 than the second impurity region 112. Similarly as in the case of the first embodiment, the number of vias V1 connecting the wiring 154 and the wiring 157 may be greater on the guard ring 117 than on the guard ring 127. In these cases, it is also possible to obtain effects similar to the effects obtainable by the first embodiment.

Second Embodiment

A second embodiment illustrates an example in which the VSS wiring has a different arrangement. In the second embodiment, a description of the same constituent elements that have been described above may be omitted.

Figure 19:
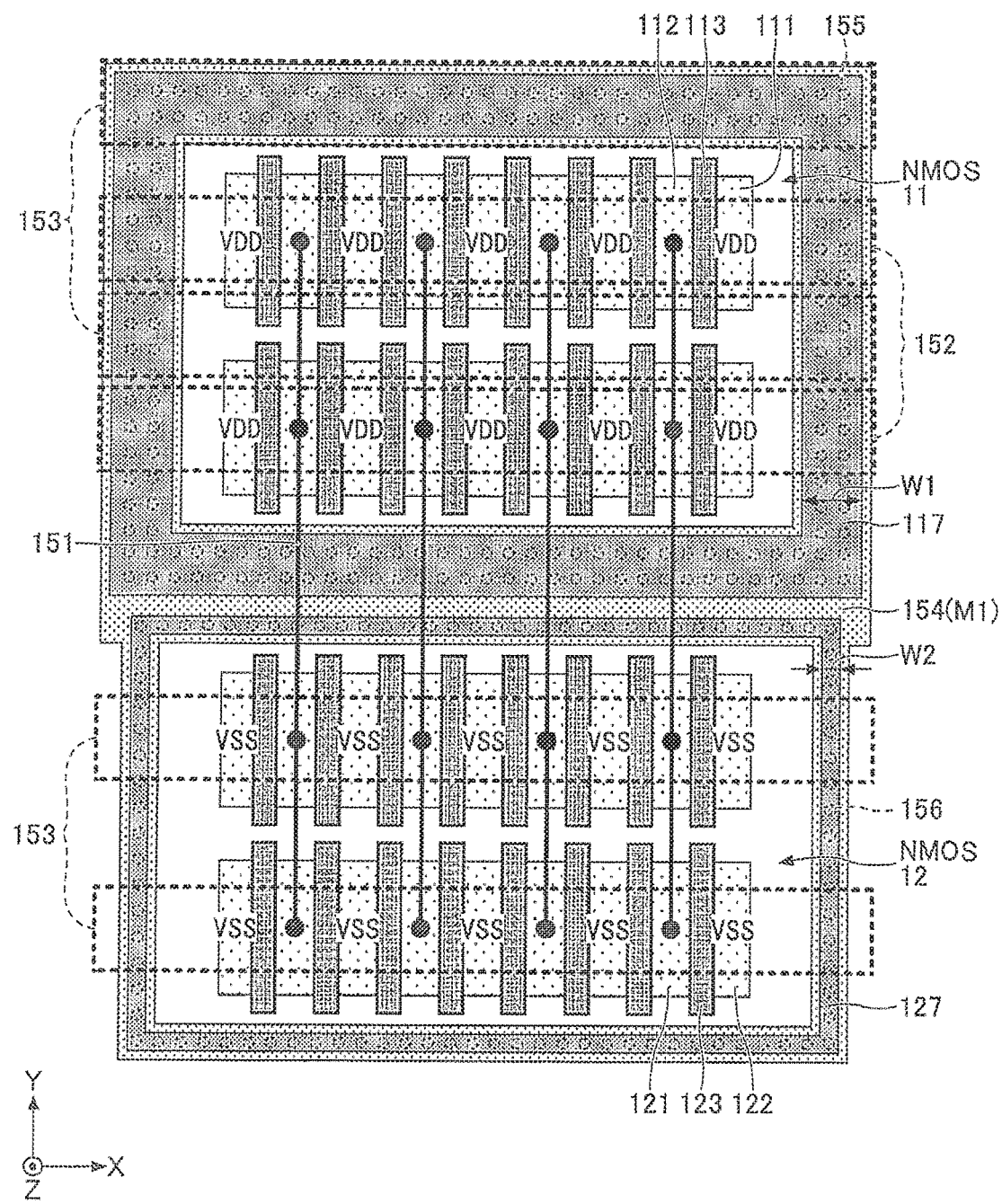
FIG. 19 is a plan view illustrating an example of the structure of the semiconductor device in a second embodiment.

FIG. 19 is a plan view illustrating an example of the structure of the semiconductor device in the second embodiment. In the first embodiment, the VSS wiring 153 is arranged only on the NMOSs 12, as illustrated in FIG. 3. In the second embodiment, the VSS wiring 153 is arranged on the NMOSs 11, in addition to being arranged on the NMOSs 12, as illustrated in FIG. 19.

In the example illustrated in FIG. 19, the VDD wirings 152 are arranged on the parts of the NMOSs 11 where the first impurity regions 111, the second impurity regions 112, or the like are formed. The VSS wirings 153 are arranged between the VDD wirings 152.

By arranging the VSS wirings 153 also on the NMOSs 11, a wiring route (or pathway) from the VSS wiring 153 to the VDD wiring 152 is shortened, so that it is possible to cause the ESD current to more easily flow towards the power supply terminal VDD.

The structure illustrated in FIG. 19 is described above for the case in which the semiconductor device includes the planar FETs. However, the structure illustrated in FIG. 19 may also be applied to the semiconductor device including the Fin FETs, and to the semiconductor device including the nanowire FETs.

Third Embodiment

A third embodiment illustrates an example in which the guard rings share a part therebetween. In the third embodiment, a description of the same constituent elements that have been described above may be omitted.

Figure 20:
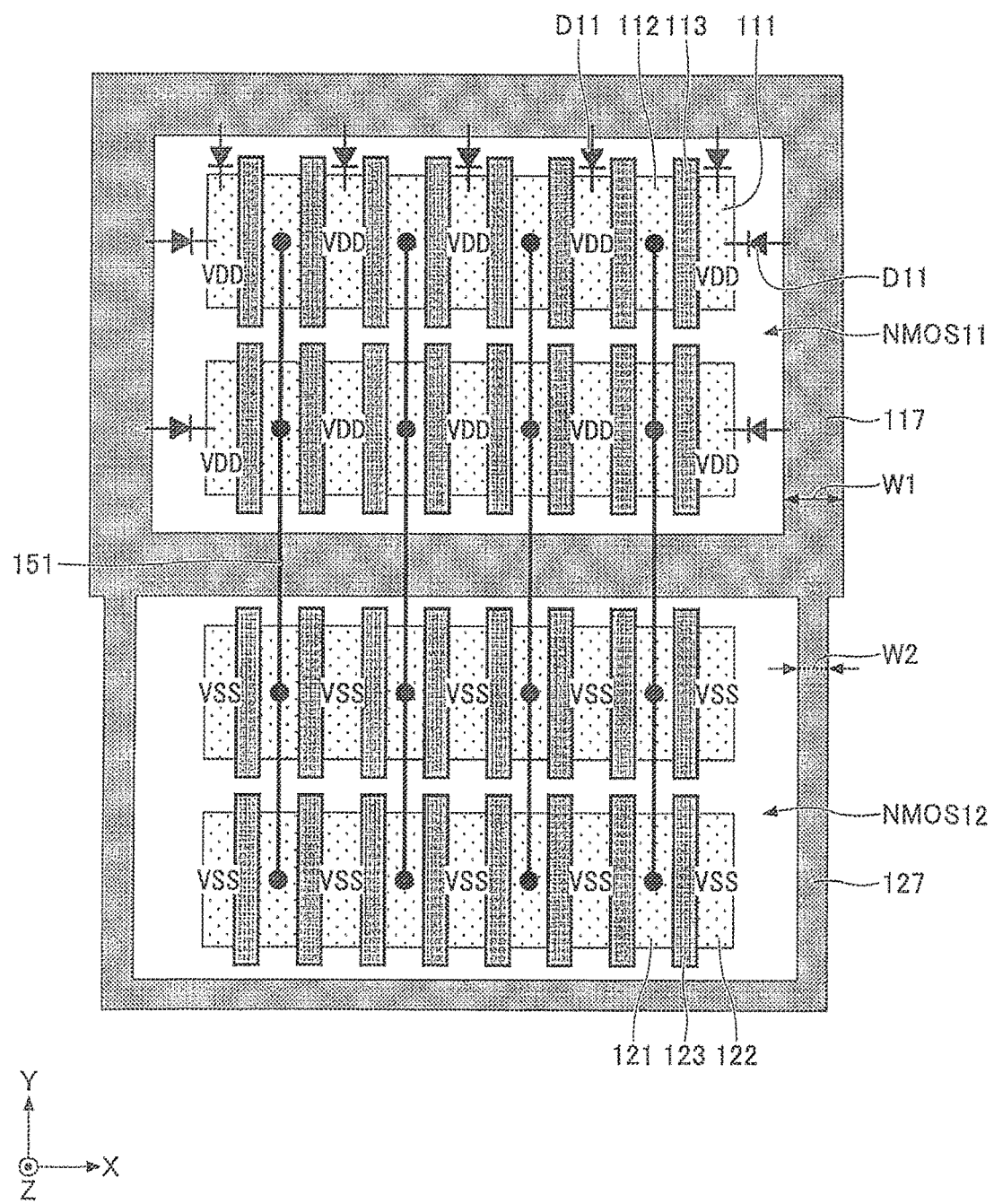
FIG. 20 is a plan view illustrating an example of the structure of the semiconductor device in a third embodiment.

FIG. 20 is a plan view illustrating an example of the structure of the semiconductor device in the third embodiment. In the first embodiment, the guard ring 117 for the NMOSs 11 and the guard ring 127 for the NMOSs 12 are provided separately, and the guard rings 117 and 127 are electrically connected through the wiring 154, as illustrated in FIG. 3. In the third embodiment, the guard ring 117 for the NMOSs 11 and the guard ring 127 for the NMOSs 12 share a part therebetween, and are connected directly to each other.

When the guard ring 117 for the NMOSs 11 and the guard ring 127 for the NMOSs 12 share a part therebetween, it is possible to reduce an area of the overall circuit.

The structure illustrated in FIG. 20 is described above for the case in which the semiconductor device includes the planar FETs. However, the structure illustrated in FIG. 20 may also be applied to the semiconductor device including the Fin FETs, and to the semiconductor device including the nanowire FETs. In addition, the structure illustrated in FIG. 20 may be combined with the second embodiment. Further, in parts other than the part that is shared between the guard ring 117 and the guard ring 127, the number of vias 155 formed on the guard ring 117 may be greater than the number of vias 156 formed on the guard ring 127, similarly as in the case of the first embodiment.

Fourth Embodiment

A fourth embodiment illustrates an example in which a part of the guard ring is eliminated. In the fourth embodiment, a description of the same constituent elements that have been described above may be omitted.

Figure 21:
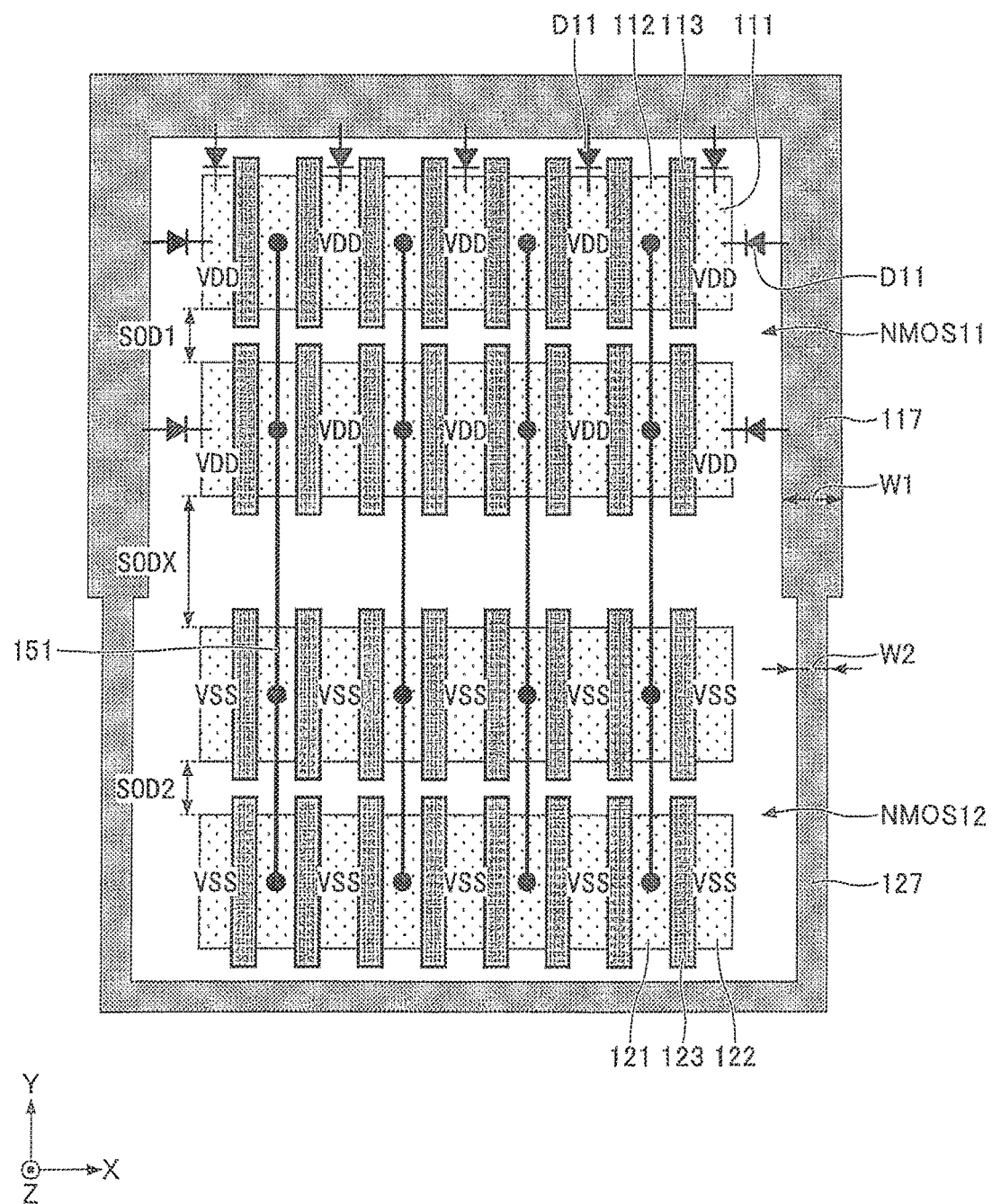
FIG. 21 is a plan view illustrating an example of the structure of the semiconductor device in a fourth embodiment.

FIG. 21 is a plan view illustrating an example of the structure of the semiconductor device in the fourth embodiment. In the third embodiment, a common guard ring part that is shared extends in the X-direction between the guard ring 117 for the NMOSs 11 and the guard ring 127 for the NMOSs 12, as illustrated in FIG. 20. In the fourth embodiment, a guard ring part between the guard ring 117 for the NMOSs 11 and the guard ring 127 for the NMOSs 12, corresponding to the common guard ring part illustrated in FIG. 20, is eliminated.

When the guard ring part between the guard ring 117 for the NMOSs 11 and the guard ring 127 for the NMOSs 12 is eliminated, it is possible to further reduce an area of the overall circuit.

A gap SODX in the Y-direction between the NMOSs 11 and the NMOSs 12 is preferably wider than a gap SOD1 in the Y-direction within the NMOSs 11, and wider than a gap SOD2 in the Y-direction within the NMOSs 12. By setting the gap SODX in this manner, it is possible to reduce the ESD current from flowing to an NPN parasitic bipolar element in the ground terminal VSS of the NMOS 12, the P-well, and the power supply terminal VDD of the NMOS 11 when the ESD is generated, and reduce damage to the NPN parasitic bipolar element.

Similarly as in the case of the third embodiment, the number of vias 155 arranged on the guard ring 117 may be greater than the number of vias 156 arranged on the guard ring 127.

Figure 22:
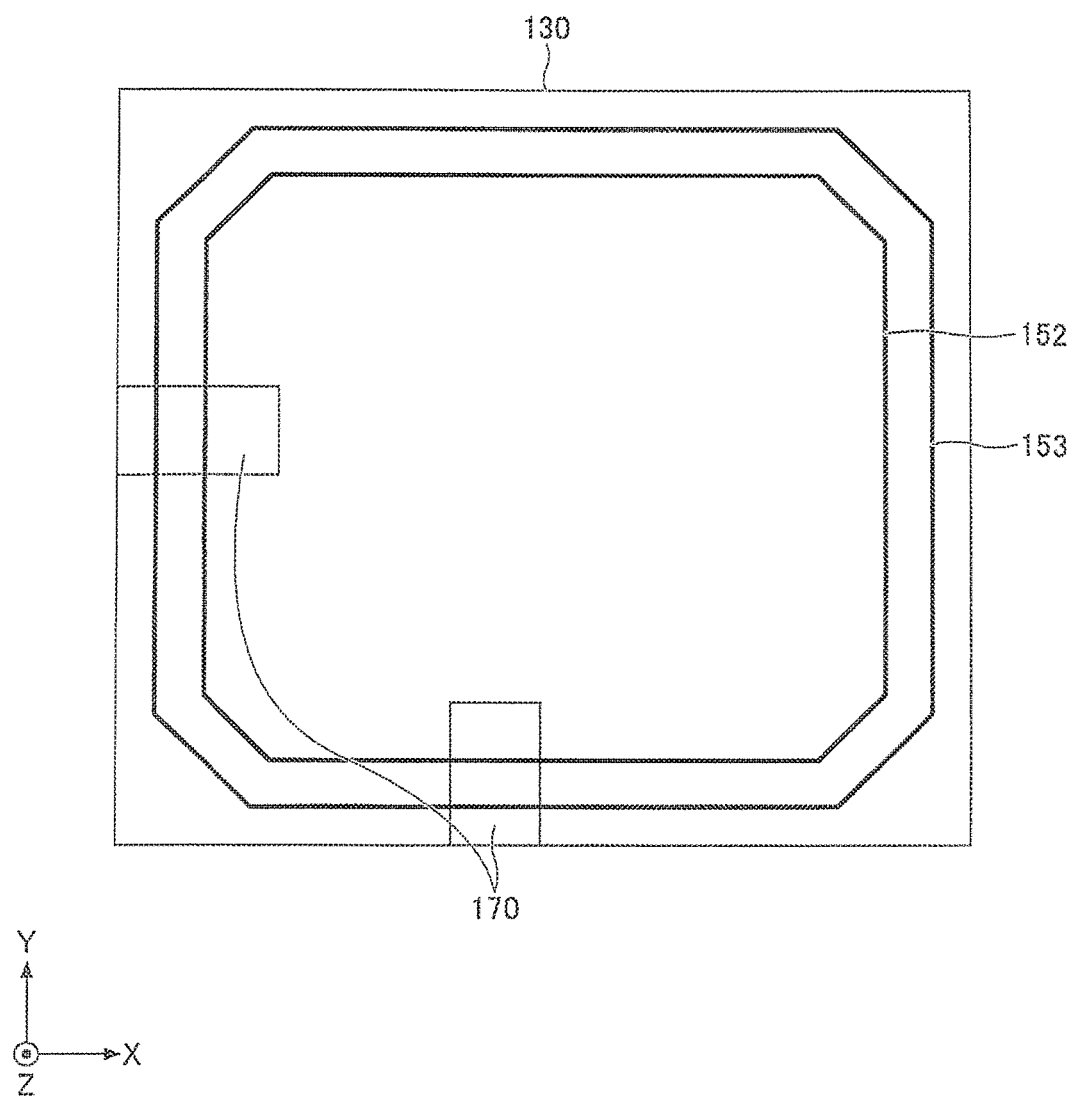

In each of the embodiments and the modifications described above, the VDD wiring 152 and the VSS wiring 153 may be arranged to surround a periphery of the substrate 130, for example, as illustrated in FIG. 22. The VDD wiring 152 and the VSS wiring 153 are arranged on an inner side of a moisture-proof ring (not illustrated) that is provided to prevent moisture or the like from entering inside the semiconductor device. However, it is not essential for the VDD wiring 152 and the VSS wiring 153 to have a ring shape, and the VDD wiring 152 may be arranged on an outer side of the VSS wiring 153.

As described above in conjunction with the first embodiment or the like, a plurality of VDD wirings 152 may be provided, and a plurality of VSS wirings 153 may be provided. In addition, as described above in conjunction with the second embodiment or the like, the plurality of VSS wirings 153 may be arranged between the plurality of VDD wirings 152, and the plurality of VDD wirings 152 and the plurality of VSS wirings 153 may be arranged alternately.

An I/O (Input/Output) cell 170 illustrated in FIG. 22 is a cell in which semiconductor elements for input and/or output are provided. The I/O cell 170 is arranged in a periphery of the substrate 130, at an upper or lower side (side extending in the X-direction) of the substrate 130, or at a right or left side (a side extending in the Y-direction) of the substrate 130. A circuit in one embodiment of the present invention, corresponding to the parts surrounded by the guard rings 117 and 127, is arranged within the I/O cell 170. However, a part or all of the I/O cell 170 may be positioned below a power supply pad, a signal input/output pad, or a dummy pad.

In a case in which the I/O cell 170 is arranged at the upper or lower side (side extending in the X-direction) of the substrate 130, the NMOSs 11 and 12 may be arranged to align in the Y-direction, as described above in conjunction with each of the embodiments and modifications. In a case in which the I/O cell 170 is arranged at the right or left side (side extending in the Y-direction) of the substrate 130, the NMOSs 11 and 12 may be arranged to align in the X-direction.

According to the embodiments and modifications described above, it is possible to provide a semiconductor device which can improve the protection capability of the ESD protection circuit.

Further, the present invention is not limited to these embodiments, but various variations, modifications, and substitutions may be made without departing from the scope of the present invention.

Each of the embodiments and modifications may be appropriately combined, if required.

Although the embodiments are numbered with, for example, "first," "second," "third," or "fourth," the ordinal numbers do not imply priorities of the embodiments. Similarly, the ordinal numbers do not imply priorities of the modifications. Many other variations and modifications will be apparent to those skilled in the art.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:
1. A semiconductor device comprising:
a first transistor which includes a first impurity region of a first conductivity type and a second impurity region of the first conductivity type, the first impurity region and the second impurity region being formed in a first fin which extends in a first direction in a plan view;
a second transistor which includes a third impurity region of the first conductivity type and a fourth impurity region of the first conductivity type, the third impurity region being electrically connected to the second impurity region, and the third impurity region and the fourth impurity region being formed in a second fin which extends in the first direction in a plan view;
a power supply terminal electrically connected to the first impurity region;
a ground terminal electrically connected to the fourth impurity region;
a first guard ring, which includes fifth impurity region of a second conductivity type different from the first impurity type, surrounding the first transistor in a plan view, the fifth impurity region being electrically connected to the ground terminal, and the fifth impurity region being formed in a third fin which extends in the first direction in a plan view; and
a second guard ring, which includes sixth impurity region of the second conductivity type, surrounding the second transistor in a plan view, the sixth impurity region being electrically connected to the ground terminal, and the sixth impurity region being formed in a fourth fin which extends in the first direction in a plan view,
wherein
the first guard ring includes a first part which extends in a second direction different from the first direction in a plan view,
the second guard ring includes a second part which extends in the second direction in a plan view, a width of the fourth fin along the first direction in the second part is narrower than a width of the third fin along the first direction in the first part in a plan view,
the first part and the first transistor are arranged in the first direction in a plan view, and
the second part and the second transistor are arranged in the first direction in a plan view.

2. The semiconductor device as claimed in claim 1, further comprising:
at least one first via formed on the first guard ring, and the first via being a part of a route that electrically connects the fourth impurity region and the ground terminal; and
at least one second via formed on the second guard ring, and the second via being a part of a route that electrically connects the sixth impurity region and the ground terminal,
wherein number of the first vias arranged in the first direction is greater than number of the second vias arranged in the first direction.

3. The semiconductor device as claimed in claim 1, further comprising:
a first wiring formed on the first guard ring and on the second guard ring,
wherein
the first wiring is electrically connected to the fifth impurity region, the sixth impurity region and the ground terminal,
the first wiring includes a third part overlapping the first guard ring in a plan view, and a fourth part overlapping the second guard ring in a plan view, and
a width of the third part along the first direction is wider than a width of the fourth part along the first direction.

4. The semiconductor device as claimed in claim 1, wherein the first impurity region is arranged at a position closer to the first guard ring than the second impurity region.

5. The semiconductor device as claimed in claim 1, further comprising:
a power supply wiring, electrically connected to the power supply terminal, and overlapping a plurality of the first transistors in a plan view; and
a ground wiring, electrically connected to the ground terminal, and overlapping a plurality of the second transistors in a plan view.

6. The semiconductor device as claimed in claim 1, further comprising:
a plurality of power supply wirings, electrically connected to the power supply terminal, and overlapping a plurality of the first transistors in a plan view; and
a plurality of ground wirings, electrically connected to the ground terminal, and overlapping a plurality of the second transistors and the plurality of the first transistors in a plan view,
wherein the power supply wirings on the plurality of first transistors and the plurality of ground wirings on the plurality of first transistors are alternately arranged in a plan view.

7. The semiconductor device as claimed in claim 1, further comprising:
a second wiring formed on the first guard ring and the second guard ring,
wherein
the second wiring is electrically connected to the second impurity region and the third impurity region.

8. The semiconductor device as claimed in claim 7, further comprising:
a first wiring formed on the first guard ring and on the second guard ring,
wherein
the first wiring is electrically connected to the fifth impurity region, the sixth impurity region and the ground terminal, and
the second wiring is positioned on the first wiring.

9. The semiconductor device as claimed in claim 8, wherein
the first wiring includes a third part overlapping the first guard ring in a plan view, and a fourth part overlapping the second guard ring in a plan view, and
a width of the third part along the first direction is wider than a width of the fourth part along the first direction.

10. A semiconductor device comprising:
a first transistor which includes a first impurity region of a first conductivity type and a second impurity region of the first conductivity type, the first impurity region and the second impurity region being formed in a first fin which extends in first direction in a plan view;
a second transistor which includes a third impurity region of the first conductivity type and a fourth impurity region of the first conductivity type, the third impurity region being electrically connected to the second impurity region, and the third impurity region and the fourth impurity region being formed in a second fin which extends in the first direction in a plan view;
a power supply terminal electrically connected to the first impurity region;
a ground terminal electrically connected to the fourth impurity region;
a first guard ring, which includes fifth impurity region of a second conductivity type different from the first impurity type, surrounding the first transistor in a plan view, the fifth impurity region being electrically connected to the ground terminal, and the fifth impurity region being formed in a third fin which extends in the first direction in a plan view; and
a second guard ring, which includes sixth impurity region of the second conductivity type, surrounding the second transistor in a plan view, the sixth impurity region being electrically connected to the ground terminal, and the sixth impurity region being formed in a fourth fin which extends in the first direction in a plan view,
wherein
the first guard ring includes a first part which extends in the first direction in a plan view,
the second guard ring includes a second part which extends in the first direction in a plan view, and
number of the third fins of the first part arranged in second direction different from the first direction in a plan view is greater than number of the fourth fins of the second part arranged in the second direction.

11. The semiconductor device as claimed in claim 10, further comprising:
at least one first via formed on the first guard ring, and the first via being a part of a route that electrically connects the fourth impurity region and the ground terminal; and
at least one second via formed on the second guard ring, and the second via being a part of a route that electrically connects the sixth impurity region and the ground terminal,
wherein number of the first vias arranged in the first direction is greater than number of the second vias arranged in the first direction.

12. The semiconductor device as claimed in claim 10, further comprising:
a first wiring formed on the first guard ring and on the second guard ring, wherein
the first wiring is electrically connected to the fifth impurity region, the sixth impurity region and the ground terminal,
the first wiring includes a third part overlapping the first guard ring in a plan view, and a fourth part overlapping the second guard ring in a plan view, and
a width of the third part along the first direction is wider than a width of the fourth part along the first direction.

13. The semiconductor device as claimed in claim 10, wherein the first impurity region is arranged at a position closer to the first guard ring than the second impurity region.

14. The semiconductor device as claimed in claim 10, further comprising:
a power supply wiring, electrically connected to the power supply terminal, and overlapping a plurality of the first transistors in a plan view; and
a ground wiring, electrically connected to the ground terminal, and overlapping a plurality of the second transistors in a plan view.

15. The semiconductor device as claimed in claim 10, further comprising:
a plurality of power supply wirings, electrically connected to the power supply terminal, and overlapping a plurality of the first transistors in a plan view; and
a plurality of ground wirings, electrically connected to the ground terminal, and overlapping a plurality of the second transistors and the plurality of first transistors in a plan view,
wherein the power supply wirings on the plurality of first transistors and the plurality of ground wirings on the plurality of first transistors are alternately arranged in a plan view.

16. The semiconductor device as claimed in claim 10, further comprising:
a second wiring formed on the first guard ring and the second guard ring,
wherein
the second wiring is electrically connected to the second impurity region and the third impurity region.

17. The semiconductor device as claimed in claim 16, further comprising:
a first wiring formed on the first guard ring and on the second guard ring,
wherein
the first wiring is electrically connected to the fifth impurity region, the sixth impurity region and the ground terminal, and
the second wiring is positioned on the first wiring.

18. The semiconductor device as claimed in claim 17 wherein
the first wiring includes a third part overlapping the first guard ring in a plan view, and a fourth part overlapping the second guard ring in a plan view, and
a width of the third part along the first direction is wider than a width of the fourth part along the first direction.

* * * * *